US011289506B2

(12) United States Patent
Omura

(10) Patent No.: US 11,289,506 B2
(45) Date of Patent: Mar. 29, 2022

(54) SEMICONDUCTOR MEMORY DEVICE AND METHOD FOR MANUFACTURING SAME

(71) Applicant: Kioxia Corporation, Minato-ku (JP)

(72) Inventor: Mitsuhiro Omura, Kanagawa-ken (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/809,735

(22) Filed: Mar. 5, 2020

(65) Prior Publication Data

US 2020/0212062 A1 Jul. 2, 2020

Related U.S. Application Data

(60) Division of application No. 15/635,398, filed on Jun. 28, 2017, now abandoned, which is a division of
(Continued)

(30) Foreign Application Priority Data

Jun. 22, 2011 (JP) .................................. 2011-138387

(51) Int. Cl.
*H01L 29/788* (2006.01)
*H01L 27/11582* (2017.01)
(Continued)

(52) U.S. Cl.
CPC ...... *H01L 27/11582* (2013.01); *H01L 23/528* (2013.01); *H01L 23/5226* (2013.01);
(Continued)

(58) Field of Classification Search
CPC ......... H01L 27/11582; H01L 27/11568; H01L 27/11565; H01L 23/5226; H01L 23/528;
(Continued)

(56) References Cited

U.S. PATENT DOCUMENTS 7,695,559 B1 4/2010 Arai et al.
8,048,741 B2 11/2011 Arai et al.
(Continued)

FOREIGN PATENT DOCUMENTS

JP 2003-309261 A 10/2003
JP 2007-27595 2/2007
(Continued)

OTHER PUBLICATIONS

Japanese Office Action issued May 12, 2014 in Patent Application No. 2011-138387 (w/English translation).

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

According to one embodiment, a method for manufacturing a semiconductor memory device includes forming a stacked body by alternately stacking an insulating film and a conductive film. The method includes forming a trench in the stacked body. The trench extends in one direction and divides the conductive film. The method includes burying a diblock copolymer in the trench. The method includes phase-separating the diblock copolymer into a plurality of first blocks and an insulative second block extending in a stacking direction of the insulating film and the conductive film. The method includes forming a plurality of holes by removing the first blocks. The method includes forming charge accumulation layers on inner surfaces of the holes. And, the method includes forming a plurality of semiconductor pillars extending in the stacking direction by burying a semiconductor material in the holes.

20 Claims, 21 Drawing Sheets

Related U.S. Application Data application No. 14/981,526, filed on Dec. 28, 2015, now Pat. No. 9,728,550, which is a continuation of application No. 13/344,757, filed on Jan. 6, 2012, now Pat. No. 9,385,137.

(51) Int. Cl.
    *H01L 27/11565* (2017.01)
    *H01L 23/522* (2006.01)
    *H01L 23/528* (2006.01)
    *H01L 27/11568* (2017.01)

(52) U.S. Cl.
    CPC .. *H01L 27/11565* (2013.01); *H01L 27/11568* (2013.01); *H01L 2924/0002* (2013.01)

(58) Field of Classification Search
    CPC .......... H01L 29/7926; H01L 29/66833; H01L 27/11556; H01L 27/11524; H01L 27/1157; H01L 29/40114; H01L 29/40117
    See application file for complete search history.

(56) References Cited

U.S. PATENT DOCUMENTS

| | | | |
|---|---|---|---|
| 8,154,068 B2 | 4/2012 | Katsumata et al. | |
| 8,237,213 B2 * | 8/2012 | Liu | H01L 29/7926 257/319 |
| 8,674,426 B2 * | 3/2014 | Higuchi | H01L 27/11582 257/316 |
| 9,147,691 B2 * | 9/2015 | Sinha | H01L 27/0688 |
| 9,362,298 B2 | 6/2016 | Akutsu | |
| 9,837,434 B2 * | 12/2017 | Sakata | H01L 21/31111 |
| 10,756,109 B2 * | 8/2020 | Uchida | H01L 29/40117 |
| 2007/0158736 A1 | 7/2007 | Arai et al. | |
| 2010/0006922 A1 | 1/2010 | Matsuoka et al. | |
| 2010/0072538 A1 | 3/2010 | Kito | |
| 2010/0117137 A1 | 5/2010 | Fukuzumi et al. | |
| 2010/0120214 A1 | 5/2010 | Park et al. | |
| 2010/0144133 A1 | 6/2010 | Nomura et al. | |
| 2010/0176440 A1 | 7/2010 | Omura | |
| 2011/0019480 A1 | 1/2011 | Kito | |
| 2012/0043599 A1 | 2/2012 | Katsumata | |
| 2012/0168824 A1 | 7/2012 | Lee | |
| 2012/0176836 A1 | 7/2012 | Iguchi | |
| 2012/0211820 A1 | 8/2012 | Komori | |
| 2012/0241842 A1 | 9/2012 | Matsuda | |
| 2012/0273867 A1 | 11/2012 | Ko | |
| 2012/0326221 A1 | 12/2012 | Sinha | |
| 2013/0083601 A1 | 4/2013 | Liu | |
| 2013/0161629 A1 | 6/2013 | Han | |
| 2014/0061768 A1 | 3/2014 | Shinohara | |
| 2014/0246716 A1 | 9/2014 | Sinha | |
| 2014/0273373 A1 | 9/2014 | Makala | |
| 2015/0200199 A1 * | 7/2015 | Sakamoto | H01L 29/66825 257/329 |
| 2015/0255485 A1 | 9/2015 | Kameoka | |
| 2016/0020218 A1 | 1/2016 | Sinha | |
| 2016/0268166 A1 | 9/2016 | Nakajima | |
| 2016/0268277 A1 * | 9/2016 | Nagashima | H01L 27/11524 |

FOREIGN PATENT DOCUMENTS

| | | |
|---|---|---|
| JP | 2007-266143 | 10/2007 |
| JP | 2007-301839 | 11/2007 |
| JP | 2008-135744 A | 6/2008 |
| JP | 2010-114370 | 5/2010 |
| JP | 2011-96341 A | 5/2011 |

* cited by examiner

SEMICONDUCTOR MEMORY DEVICE AND METHOD FOR MANUFACTURING SAME

CROSS-REFERENCE TO RELATED APPLICATIONS

This application is a division of and claims the benefit of priority under 35 U.S.C. § 120 from U.S. application Ser. No. 15/635,398 filed Jun. 28, 2017, which is a division of U.S. application Ser. No. 14/981,526 filed Dec. 28, 2015 (now U.S. Pat. No. 9,728,550 issued Aug. 8, 2017), which is a continuation of U.S. application Ser. No. 13/344,757 filed Jan. 6, 2012 (now U.S. Pat. No. 9,385,137 issued Jul. 5, 2016), and claims the benefit of priority under 35 U.S.C. § 119 from Japanese Patent Application No. 2011-138387 filed Jun. 22, 2011, the entire contents of each of which are incorporated herein by reference.

FIELD

Embodiments described herein relate generally to a semiconductor memory device and a method for manufacturing the same.

BACKGROUND

Recently, as a new memory device, a nonvolatile memory based on the vertical MONOS (metal-oxide-nitride-oxide-silicon) structure has been proposed. In manufacturing this memory device, conductive films and insulating films are alternately stacked to form a stacked body. Holes extending in the stacking direction are formed in the stacked body. A charge accumulation layer is formed on the inner surface of this hole. Then, a silicon pillar is buried in the hole. Thus, a memory transistor is formed at each closest point between the conductive film and the silicon pillar.

However, in the future, the packing density of memory devices will be further increased. Then, the number of stacked conductive films is increased. Furthermore, the diameter of the hole is reduced, and the aspect ratio of the hole is increased. This makes it very difficult to form the hole with a vertical side surface, and causes the diameter of the hole to decrease downward. In this case, the upper portion and the lower portion of the hole have different diameters. This causes variations in the characteristics of the memory transistors.

DETAILED DESCRIPTION

In general, a semiconductor memory device includes a stacked body, a plurality of semiconductor pillars, charge accumulation layers and an insulating member. The stacked body includes an insulating film and a conductive film alternately stacked therein. A trench is formed in the stacked body. The trench extends in one direction. The conductive film is divided by the trench. The plurality of semiconductor pillars are provided in the trench. The semiconductor pillars extend in a stacking direction of the insulating film and the conductive film. Each of the charge accumulation layers is provided around each of the semiconductor pillars. The insulating member is provided between the charge accumulation layers in the trench.

In general, a method for manufacturing a semiconductor memory device includes forming a stacked body by alternately stacking an insulating film and a conductive film. The method includes forming a trench in the stacked body. The trench extends in one direction and divides the conductive film. The method includes burying a diblock copolymer in the trench. The method includes phase-separating the diblock copolymer into a plurality of first blocks and an insulative second block extending in a stacking direction of the insulating film and the conductive film. The method includes forming a plurality of holes by removing the first blocks. The method includes forming charge accumulation layers on inner surfaces of the holes. And, the method includes forming a plurality of semiconductor pillars extending in the stacking direction by burying a semiconductor material in the holes.

Embodiments of the invention will now be described with reference to the drawings.

First, a first embodiment is described.

Figure 1A:
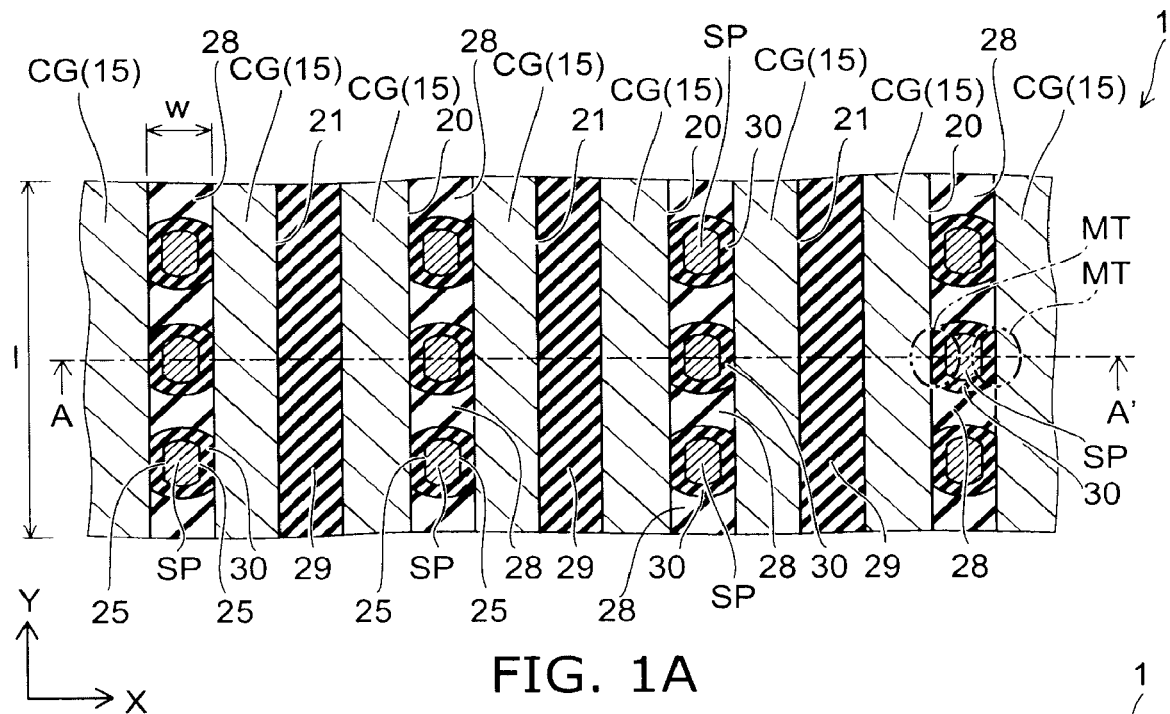
FIGS. 1A and 1B are sectional views illustrating a semiconductor memory device according to a first embodiment.
Figure 1B:
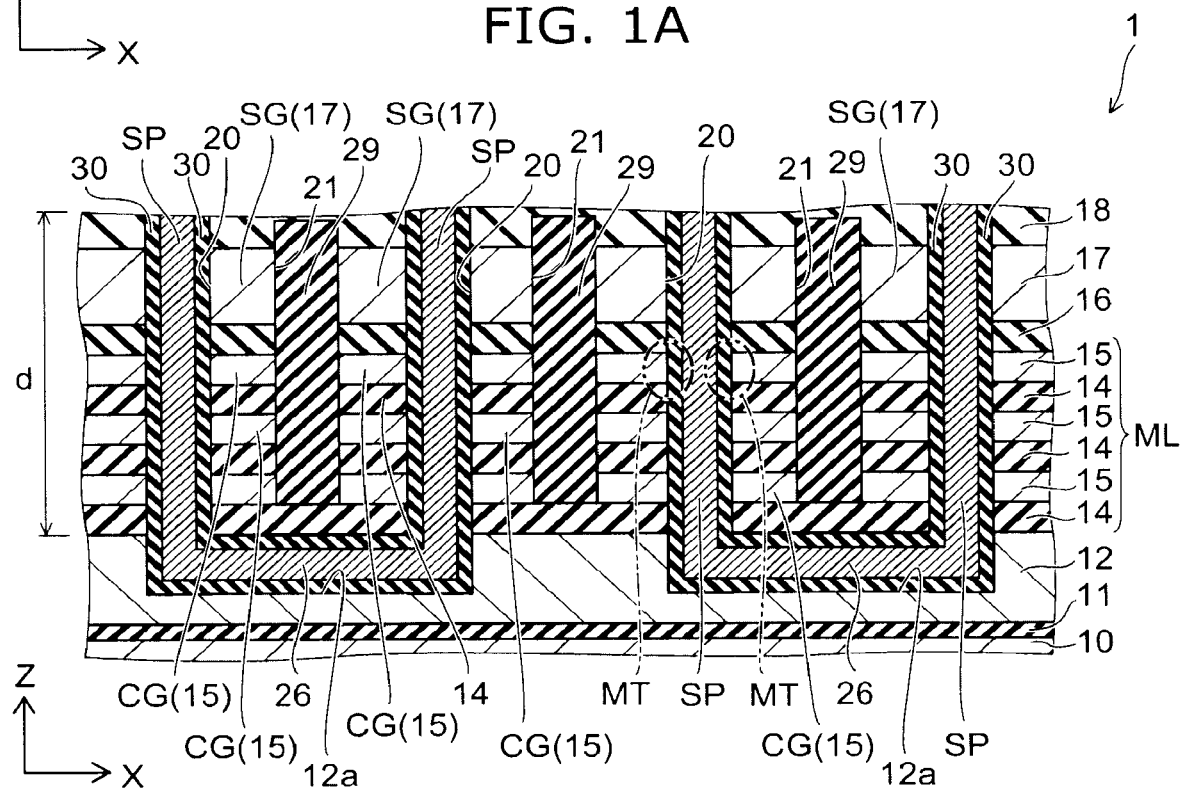

FIGS. 1A and 1B are sectional views illustrating a semiconductor memory device according to the embodiment. FIG. 1A shows a cross section parallel to the upper surface of the silicon substrate. FIG. 1B shows a cross section perpendicular to the upper surface of the silicon substrate.

Figure 2:
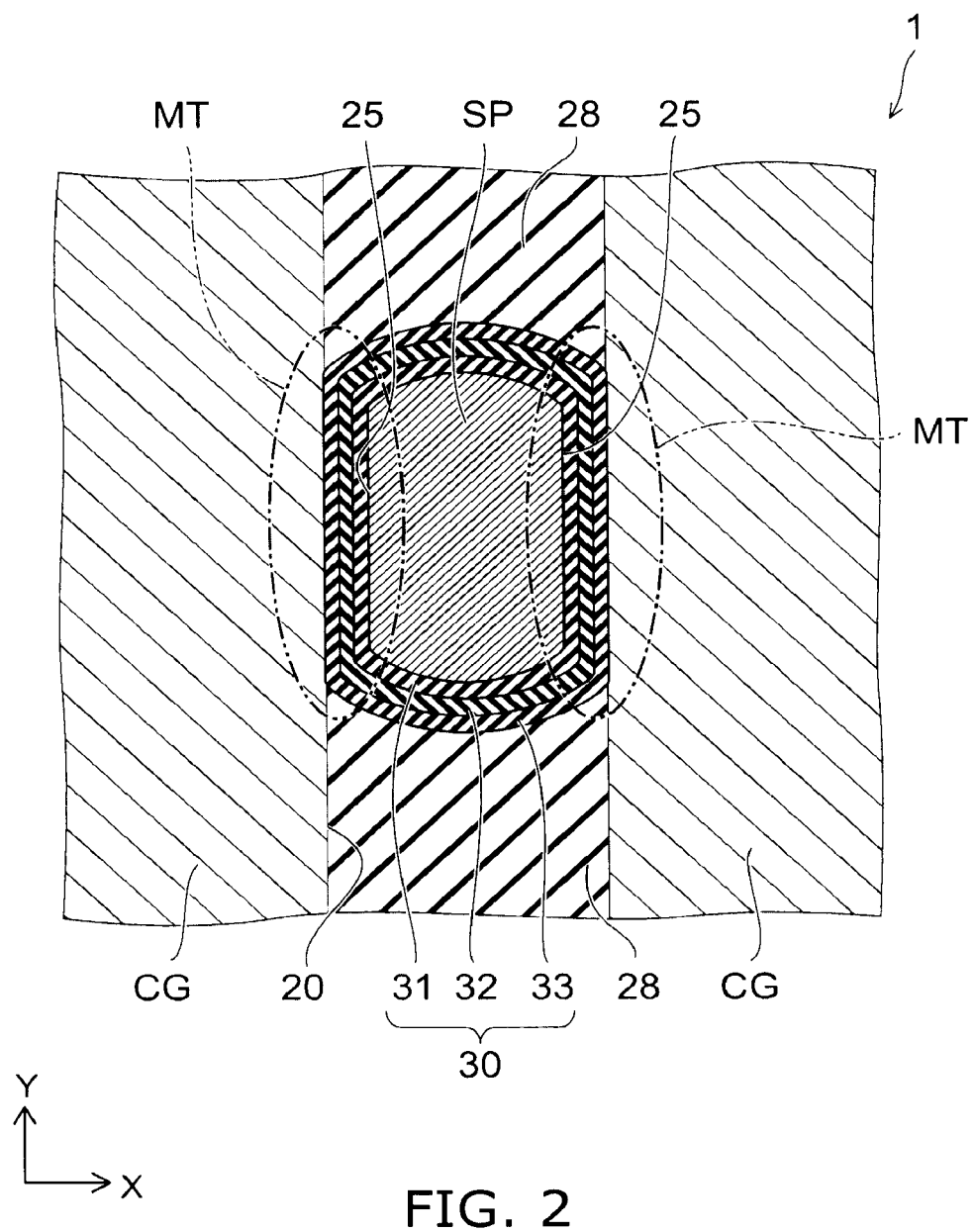
FIG. 2 is a sectional view illustrating a silicon pillar and its neighborhood in the semiconductor memory device according to the first embodiment.

FIG. 2 is a sectional view illustrating a silicon pillar and its neighborhood in the semiconductor memory device according to the embodiment.

Here, FIG. 1B is a sectional view taken along line A-A' shown in FIG. 1A.

As shown in FIGS. 1A and 1B and 2, the semiconductor memory device 1 according to the embodiment includes a silicon substrate 10. On the silicon substrate 10, a memory cell region populated with memory cells, and a peripheral circuit region (not shown) populated with driver circuits are established. The peripheral circuit region is located around the memory cell region.

In the memory cell region, an insulating film 11 is provided on the silicon substrate 10. A conductive film 12 is provided on the insulating film 11. On the conductive film 12, a plurality of insulating films 14 and conductive films 15 are alternately stacked to constitute a stacked body ML. Here, the number of insulating films 14 and conductive films 15 depicted in FIG. 1B is only three for each. However, in practice, more insulating films 14 and conductive films 15 may be stacked. On the stacked body ML, an insulating film 16, a conductive film 17, and an insulating film 18 are formed in this order. The conductive films 12, 15, and 17 are formed from a conductive material such as impurity-containing polysilicon. On the other hand, the insulating films 11, 14, 16, and 18 are formed from an insulating material such as silicon oxide.

In the following, for convenience of description, an XYZ orthogonal coordinate system is herein introduced. In this coordinate system, the two directions parallel to the upper surface of the silicon substrate 10 and orthogonal to each other are referred to as X and Y directions. The direction orthogonal to both the X and Y directions, i.e., the stacking direction of the layers, is referred to as Z direction.

Trenches 20 and 21 extending in the Y direction are alternately formed in the stacked body ML, the insulating film 16, and the conductive film 17. The trench 20 penetrates through the insulating film 18, the conductive film 17, the insulating film 16, and the stacked body ML to the conductive film 12. The trench 21 penetrates through the lower portion of the insulating film 18, the conductive film 17, the insulating film 16, and the portion of the stacked body ML except the lowermost insulating film 14. However, the trench 21 does not penetrate through the upper portion of the insulating film 18 and the lowermost insulating film 14.

The conductive film 15 is divided by the trenches 20 and 21 into a plurality of control gate electrodes CG extending in the Y direction. The conductive film 17 is divided by the trenches 20 and 21 into a plurality of select gate electrodes SG extending in the Y direction. The trench 20 is shaped like a generally rectangular solid. The trench 20 is longest along its depth d, i.e., the length in the Z direction. The trench 20 is second longest along its longitudinal length l, i.e., the length in the Y direction. The trench 20 is shortest along its width w, i.e., the length in the X direction. That is, these dimensions satisfy $d>l>w$.

In the trench 20, a plurality of silicon pillars SP extending in the Z direction (stacking direction) are provided. The silicon pillar SP is formed from impurity-doped polysilicon. In each trench 20, the silicon pillars SP are equally spaced in a line along the Y direction. The number of silicon pillars SP provided in each trench 20 is e.g. three.

The silicon pillar SP is shaped like a circular column with the central axis extending in the Z direction in which the two side portions of this circular column opposed to the inner surface of the trench 20 are trimmed along the YZ plane. That is, the region 25 of the side surface of the silicon pillar SP opposed to the inner surface of the trench 20 is parallel to the YZ plane and parallel to the side surface of the trench 20. Hence, as viewed in the Z direction, the outer edge of the silicon pillar SP includes a pair of circular arcs and a pair of line segments.

In the upper surface of the conductive film 12, a recess 12a shaped like a generally rectangular solid with the longitudinal direction aligned with the X direction is formed. Inside the recess 12a, a coupling member 26 made of impurity-doped polysilicon is provided. The coupling member is shaped like a generally rectangular solid with the longitudinal direction aligned with the X direction. Both end portions of the coupling member 26 are exposed at the bottom surface of two adjacent trenches 20. The central portion of the coupling member 26 is located immediately below the trench 21. To the upper surfaces of both end portions of the coupling member 26, the lower ends of two silicon pillars SP adjacent in the X direction are coupled.

The coupling member 26 is formed integrally with these two silicon pillars SP. Hence, these two silicon pillars SP are connected to each other via the coupling member 26. One of the two silicon pillars SP connected to both ends of one coupling member 26 is connected to a source line (not shown), and the other is connected to a bit line (not shown). The source line is provided on the select gate electrode SG and extends in the Y direction. The bit line is provided on the source line and extends in the X direction.

A memory film 30 is provided around the silicon pillar SP, i.e., on the entire region of the side surface, and around the coupling member 26. In the memory film 30, a tunnel layer 31, a charge accumulation layer 32, and a block layer 33 are stacked sequentially from inside, i.e., from the side of the silicon pillar SP and the coupling member 26. The tunnel layer 31 is a layer which is normally insulative, but passes a tunnel current under application of a prescribed voltage in the range of the driving voltage of the semiconductor memory device 1. The tunnel layer 31 is formed from e.g. silicon oxide. The charge accumulation layer 32 is a layer capable of trapping charge, and is formed from e.g. silicon nitride. The block layer 33 is a layer which substantially blocks the flow of current even under application of voltage in the range of the driving voltage of the semiconductor memory device 1. The block layer 33 is formed from e.g. silicon oxide. In this case, the memory film 30 is an ONO (oxide-nitride-oxide) film. Thus, the control gate electrode CG, the memory film 30, and the silicon pillar SP constitute a MONOS structure. The silicon pillar SP is insulated from the conductive film 12, the control gate electrode CG, and the select gate electrode SG by the memory film 30.

Between the memory films 30 in the trench 20, an insulating member 28 is provided. The insulating member 28 is formed primarily from silicon oxide. However, the insulating member 28 is a member formed by a method different from that for the insulating films 11, 14, 16, and 18. Hence, the composition of the insulating member 28 is slightly different from the composition of these insulating films. The insulating member 28 contains a trace amount of organic residual components besides silicon oxide. As described later, for instance, the insulating member 28 is formed by heat treatment of polyethylene oxide in a diblock copolymer of polystyrene and polyethylene oxide.

On the other hand, in the trench 21, an insulating member 29 shaped like a plate along the YZ plane is provided. The insulating member 29 is formed from e.g. silicon nitride.

In the semiconductor memory device 1, the silicon pillar SP functions as a channel, the control gate electrode CG functions as a gate electrode, and the charge accumulation layer 32 accumulates electrons. Thus, a vertical memory transistor MT is formed at each closest point between the silicon pillar SP and the control gate electrode CG. In the semiconductor memory device 1, a plurality of memory transistors MT are arranged three-dimensionally along the X, Y, and Z directions.

Next, a method for manufacturing a semiconductor memory device according to the embodiment is described.

FIGS. 3A to 13B are process views illustrating the method for manufacturing a semiconductor memory device according to the embodiment. Here, the figures labeled with "A" are plan views. The figures labeled with "B" are sectional views taken along line A-A' shown in the corresponding figures labeled with "A".

Figure 3A:
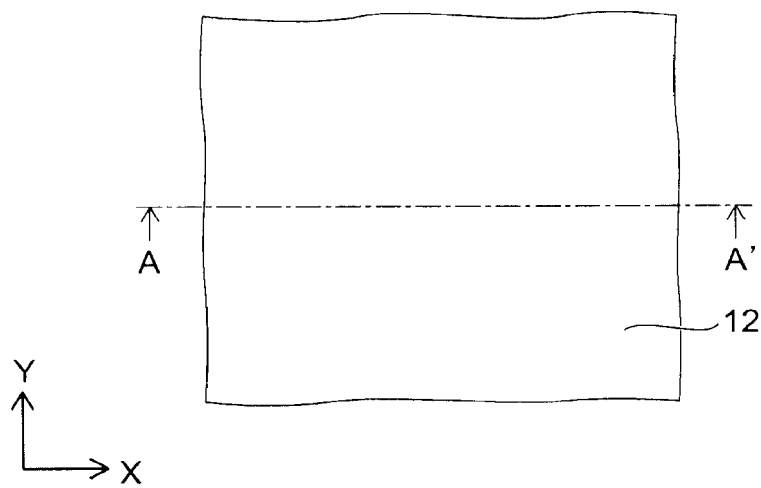
FIGS. 3A to 13B are process views illustrating a method for manufacturing a semiconductor memory device according to the first embodiment.
Figure 3B:
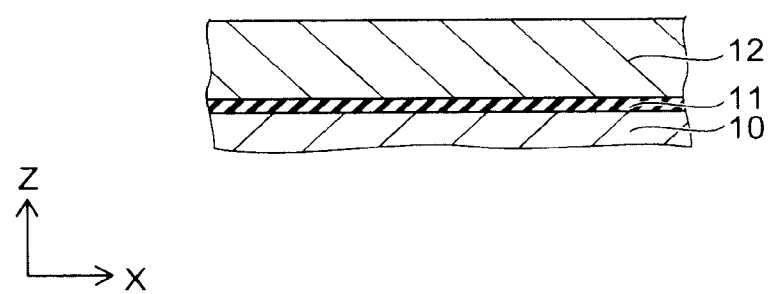

First, as shown in FIGS. 3A and 3B, a silicon substrate 10 is prepared. Next, in the peripheral circuit region (not shown) of this silicon substrate 10, transistors and wirings, for instance, constituting driver circuits are formed.

Next, by e.g. the CVD (chemical vapor deposition) process, an insulating film 11 made of silicon oxide is formed on the silicon substrate 10. Then, a conductive film 12 made of impurity-containing polysilicon is formed on the insulating film 11.

Figure 4A:
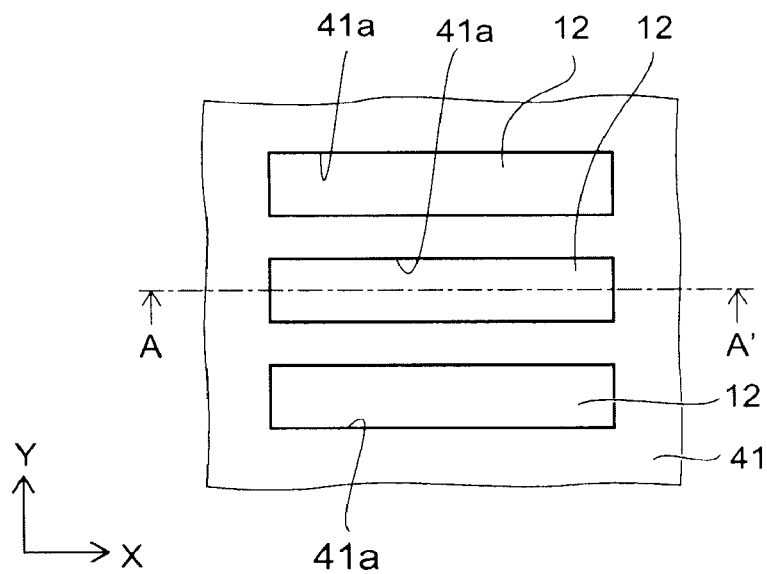
Figure 4B:
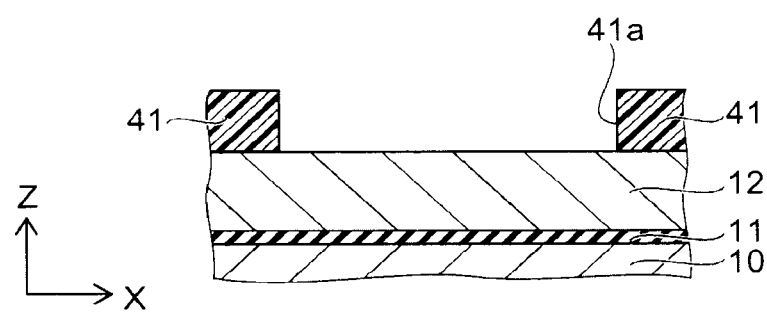

Next, as shown in FIGS. 4A and 4B, a resist film 41 is formed on the conductive film 12. Next, by the lithography technique, a plurality of strip-shaped openings 41a with the longitudinal direction aligned with the X direction are formed in the resist film 41. The openings 41a are arranged in a matrix configuration along the X and Y directions.

Figure 5A:
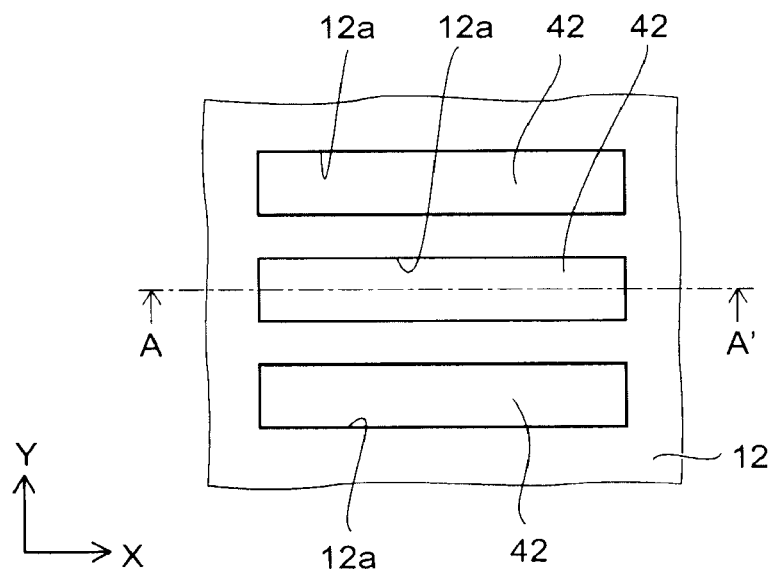
Figure 5B:
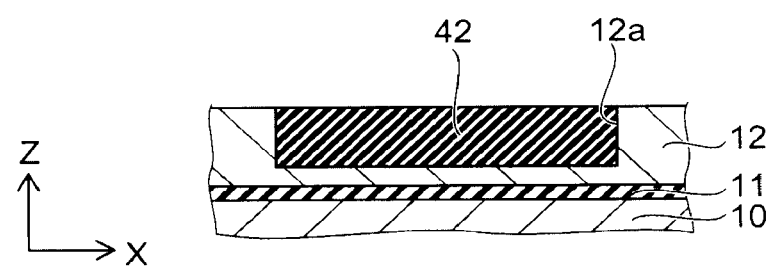

Next, as shown in FIGS. 5A and 5B, the resist film 41 (see FIGS. 4A and 4B) is used as a mask to perform dry etching. Thus, a recess 12a shaped like a rectangular solid with the longitudinal direction aligned with the X direction is formed in the upper portion of the conductive film 12. Subsequently, ashing is performed to remove the resist film 41.

Next, by the CVD process, silicon nitride is deposited on the entire surface. Next, dry etching is performed to remove the portion of the silicon nitride deposited on the upper surface of the conductive film 12. Thus, a sacrificial material 42 made of silicon nitride is buried in the recess 12a.

Figure 6A:
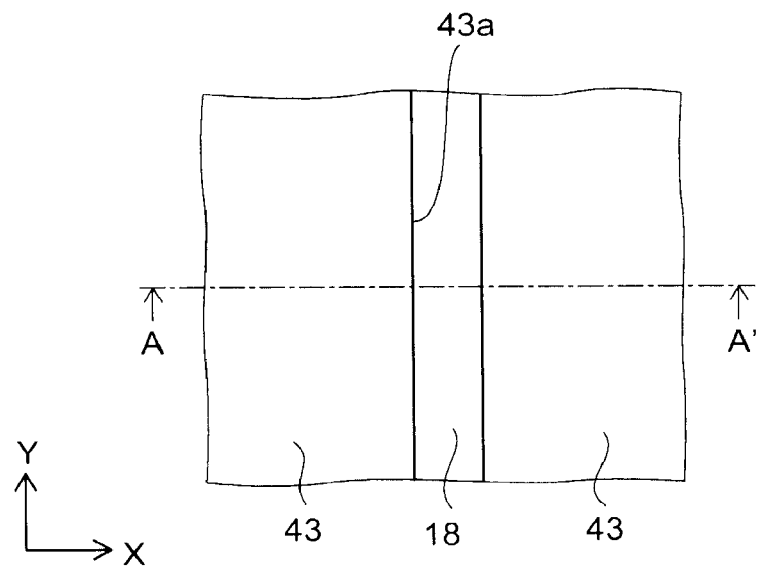
Figure 6B:
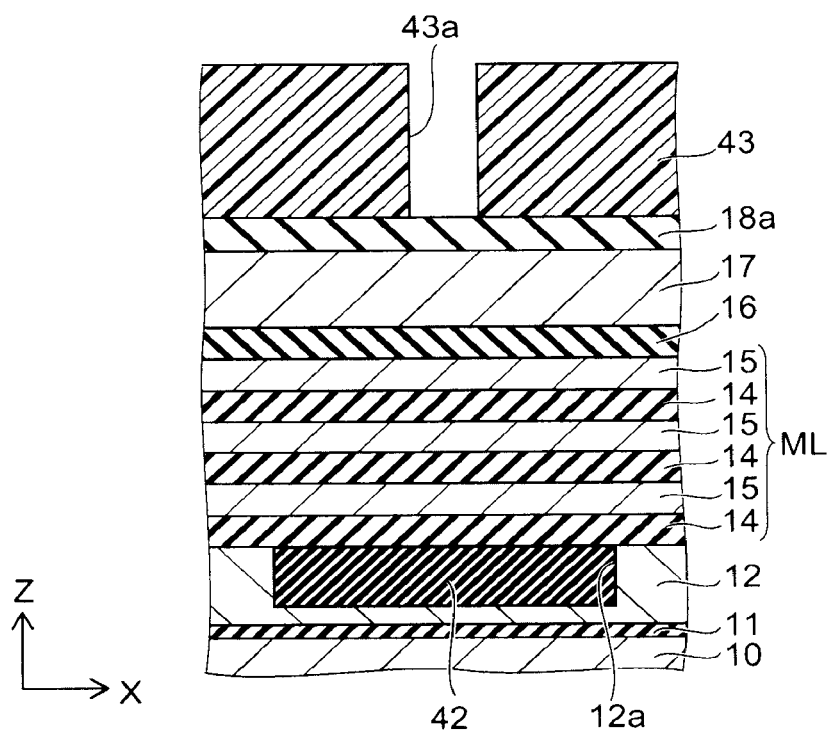

Next, as shown in FIGS. 6A and 6B, insulating films 14 made of silicon oxide and conductive films 15 made of polysilicon are alternately formed on the conductive film 12 and the sacrificial material 42. Thus, a stacked body ML is formed. Next, on the stacked body ML, an insulating film 16 made of silicon oxide, a conductive film 17 made of polysilicon, and an insulating film 18a made of silicon oxide are deposited in this order. Next, a resist film 43 is formed on the insulating film 18a. Next, by the lithography technique, a plurality of groove-shaped openings 43a extending in the Y direction are formed in the resist film 43.

Figure 7A:
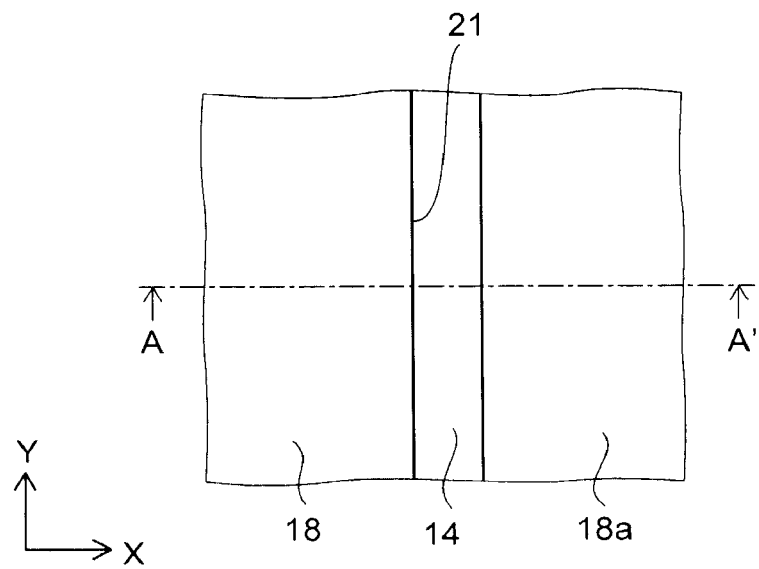
Figure 7B:
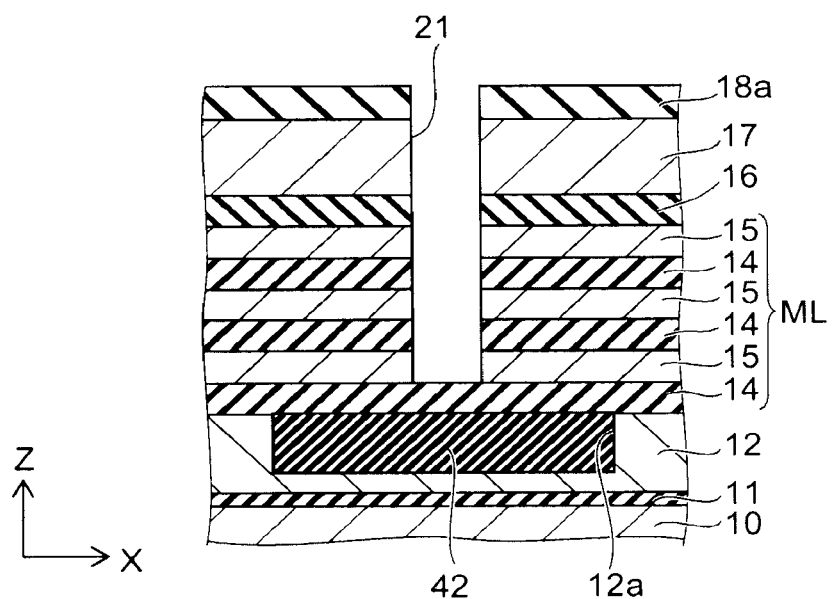

Next, as shown in FIGS. 7A and 7B, the resist film 43 (see FIGS. 6A and 6B) is used as a mask to perform dry etching to selectively remove the insulating film 18a, the conductive film 17, the insulating film 16, and the stacked body ML. At this time, the lowermost insulating film 14 of the stacked body ML is left unetched. Thus, a trench 21 extending in the Y direction is formed in the portion of the stacked body ML except the lowermost insulating film 14, the insulating film 16, the conductive film 17, and the insulating film 18a. The trench 21 is formed immediately below the opening 43a at a position linking the immediately overlying regions of the X-direction central portions of the sacrificial materials 42. Subsequently, ashing is performed to remove the resist film 43.

Figure 8A:
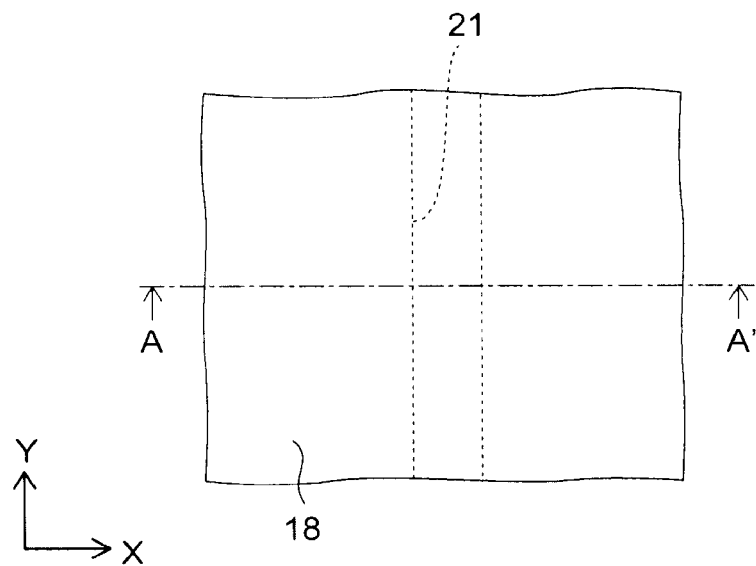
Figure 8B:
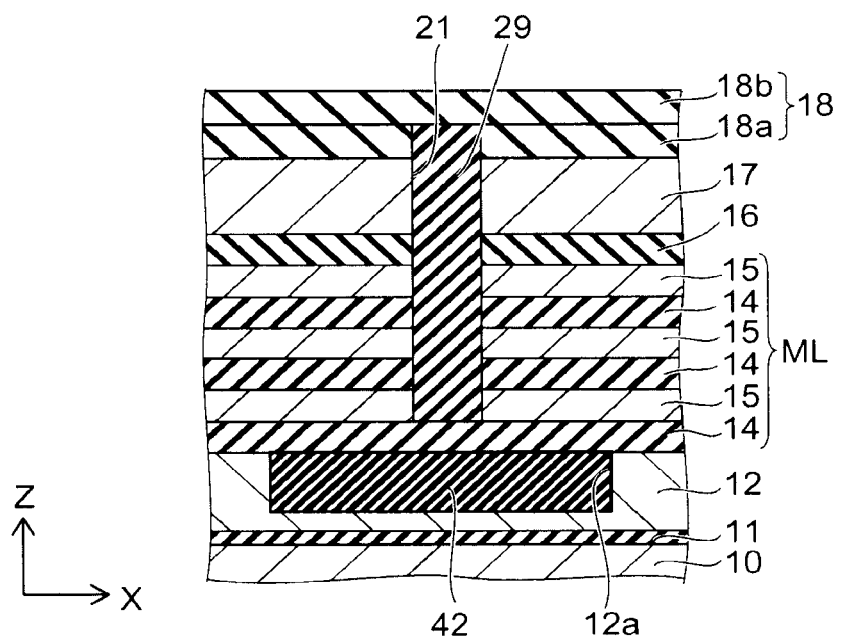

Next, as shown in FIGS. 8A and 8B, silicon nitride is deposited by the CVD process. Next, dry etching is performed to remove the portion of the silicon nitride deposited on the insulating film 18a. Thus, an insulating member 29 made of silicon nitride is buried in the trench 21. Next, silicon oxide is deposited by the CVD process to form an insulating film 18b on the insulating film 18a. The insulating films 18a and 18b constitute an insulating film 18.

Figure 9A:
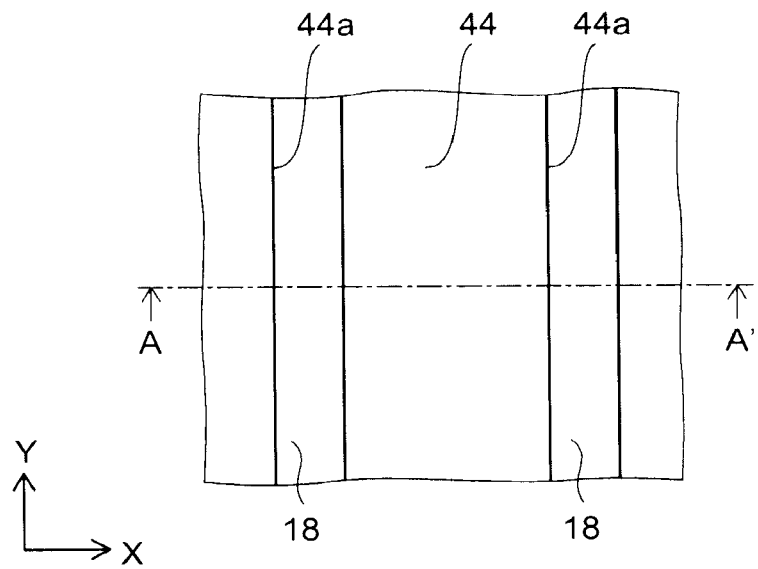
Figure 9B:
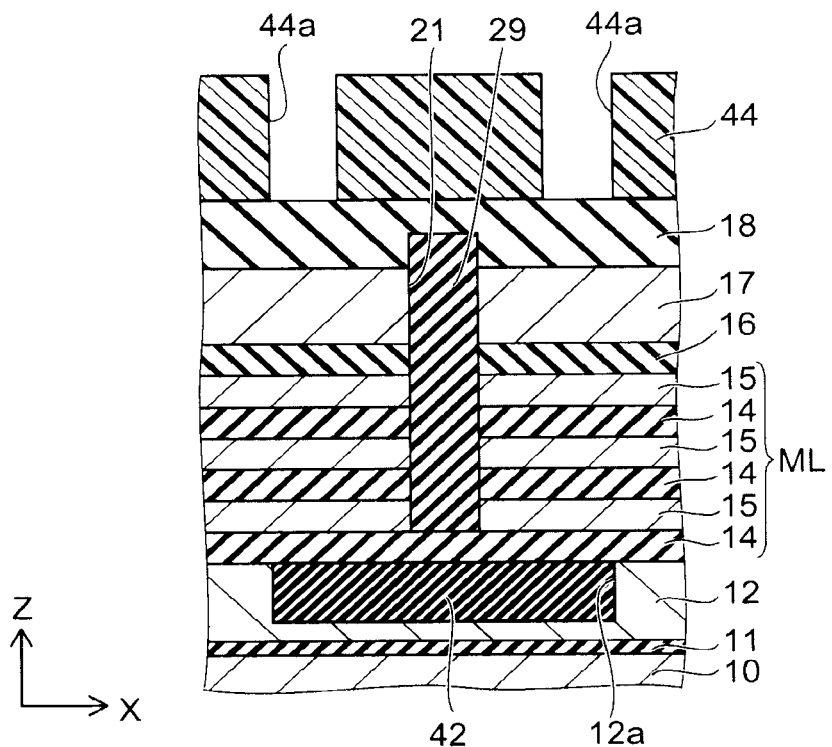

Next, as shown in FIGS. 9A and 9B, a resist film 44 is formed on the insulating film 18. Next, by the lithography technique, an opening 44a extending in the Y direction is formed in the resist film 44. The opening 44a is formed at a position linking the immediately overlying regions of both X-direction end portions of the sacrificial materials 42.

Figure 10A:
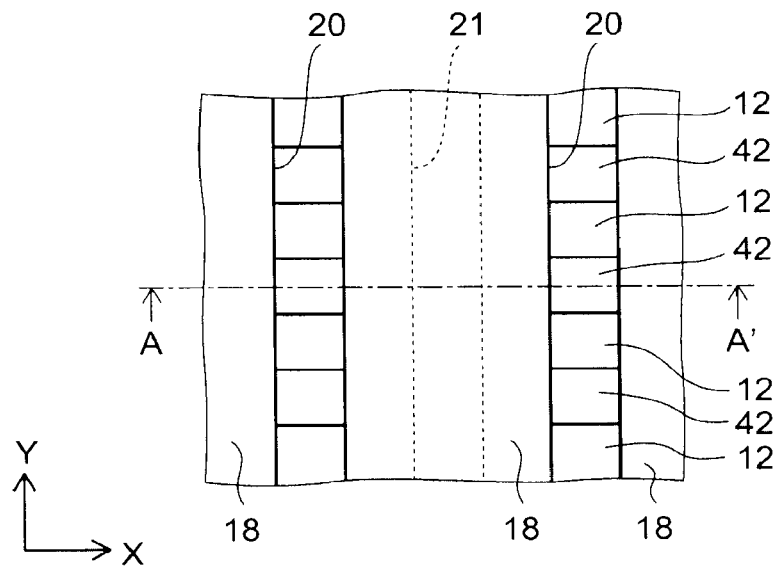
Figure 10B:
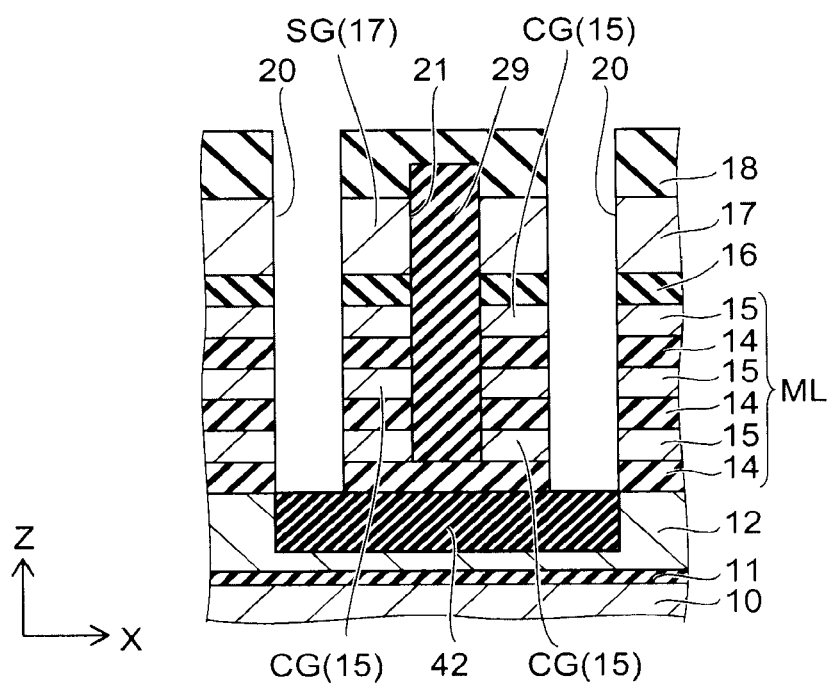

Next, as shown in FIGS. 10A and 10B, the resist film 44 (see FIGS. 9A and 9B) is used as a mask to perform dry etching to selectively remove the insulating film 18, the conductive film 17, the insulating film 16, and the stacked body ML. Thus, a trench 20 extending in the Y direction is formed immediately below the opening 44a. The trench 20 is shaped like a generally rectangular solid. In the trench 20, the length l is made longer than the width w, and the depth d is made longer than the length l. That is, these dimensions are set to satisfy d>l>w. At the bottom surface of the trench 20, the conductive films 12 and the sacrificial materials 42 are exposed and alternately arranged along the Y direction. Thus, the conductive film 17 is divided by the trenches 20 and 21 into a plurality of select gate electrodes SG. Furthermore, each conductive film 15 is divided by the trenches 20 and 21 into a plurality of control gate electrodes CG. Subsequently, ashing is performed to remove the resist film 44.

Next, by a self-organization technique, a cylindrical (circular columnar) hole is formed in the trench 20. A method for this is specifically described below.

Figure 11A:
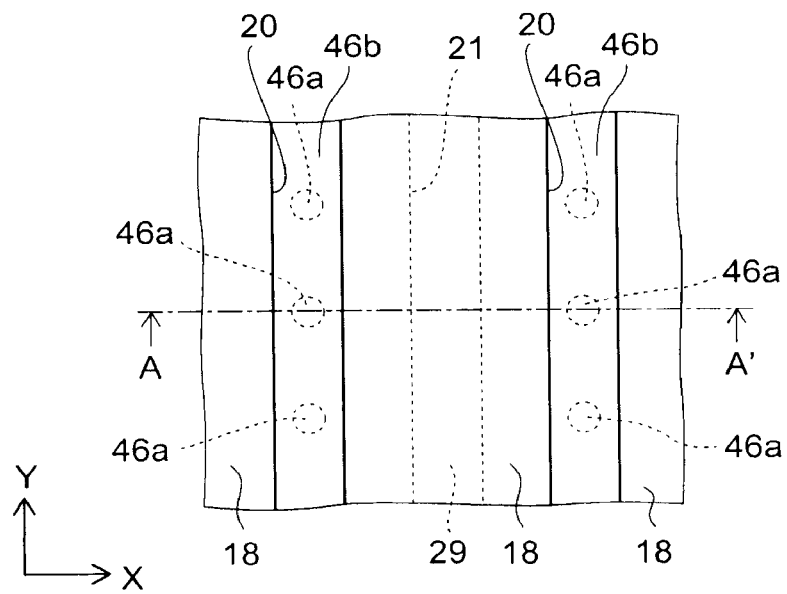
Figure 11B:
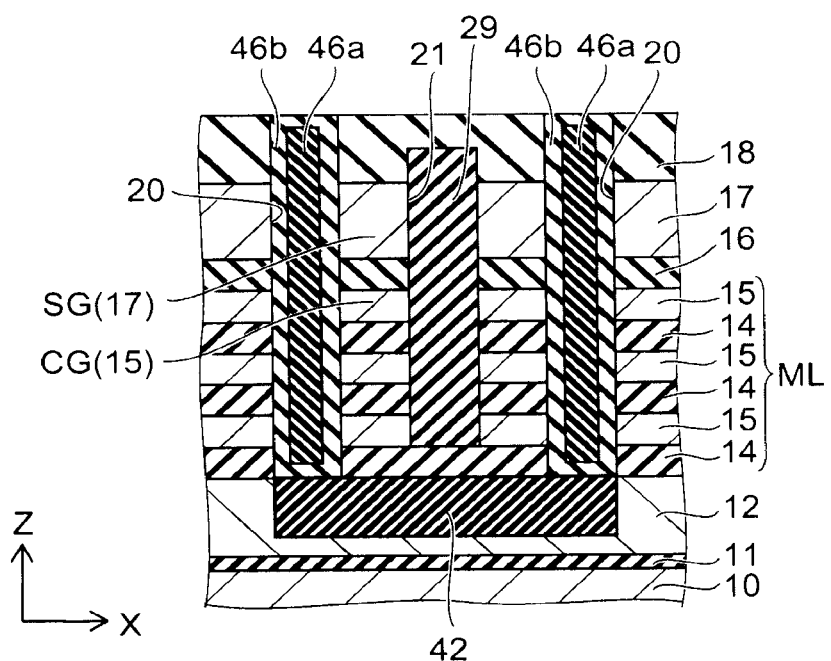

First, as shown in FIGS. 11A and 11B, as a block copolymer, a diblock copolymer is applied and buried in the trench 20. The diblock copolymer is a polymer of two kinds of macromolecules which are phase-separated under an appropriate condition. Various materials can be used as the diblock copolymer. In the embodiment, a polymer of polystyrene (PS) and polyethylene oxide (PEO) is used (this polymer is hereinafter referred to as "PS-PEO polymer"). In the PS-PEO polymer, polystyrene (PS) groups and polyethylene oxide (PEO) groups are coupled in a straight chain.

Next, by e.g. heat treatment, the diblock copolymer is phase-separated. Thus, in the trench 20, the PS-PEO polymer as the diblock copolymer is separated into a block 46a resulting from polystyrene (PS) groups and a block 46b resulting from polyethylene oxide (PEO) groups. The block 46a is made of an organic material. The block 46b is made of silicon oxide in which a small amount of organic residual material is left behind. That is, the block 46b is substantially made of an inorganic material.

The inner surface of the trench 20 includes the insulating films 14, 16, and 18 made of silicon oxide, the conductive films 12, 15, 17 made of silicon, and the sacrificial material 42 made of silicon nitride. Thus, the inner surface of the trench 20 is entirely hydrophilic. On the other hand, polyethylene oxide (PEO) is hydrophilic, whereas polystyrene (PS) is hydrophobic. That is, the diblock copolymer used in the embodiment is a copolymer having hydrophobic first molecules and hydrophilic second molecules. Hence, the interfacial energy between the hydrophilic inner surface of the trench 20 and hydrophilic polyethylene oxide (PEO) is lower than the interfacial energy between the hydrophilic inner surface of the trench 20 and hydrophobic polystyrene (PS). Thus, in each PS-PEO polymer, the polyethylene oxide (PEO) group is coupled to the inner surface of the trench 20, whereas the polystyrene (PS) group is located at a position spaced from the inner surface of the trench 20 by the length of the PEO group. As a result, the block 46b resulting from polyethylene oxide (PEO) groups is aggregated along the inner surface of the trench 20. On the other hand, the block 46a resulting from polystyrene (PS) groups is aggregated at a position spaced by a fixed distance from the inner surface of the trench 20.

Here, the shape and position of the blocks 46a and 46b can be controlled by selecting e.g. the size and shape of the trench 20, the total molecular weight of the PS-PEO polymer, the ratio between PEO groups and PS groups, and the heat treatment condition for phase separation. For instance, the shape of the block 46a can be controlled by selecting the ratio between PS groups and PEO groups in the PS-PEO polymer. For instance, the ratio between PS groups and PEO groups being approximately 1:1 produces a lamellar structure in which the blocks 46a and the blocks 46b are alternately arranged. If the ratio of PS groups is lower, the block 46a is shaped like a cylinder (circular column). If the ratio of PS groups is still lower, the block 46a is shaped like a ball. Furthermore, the formation position of the block 46a can be controlled by selecting e.g. the size and shape of the trench 20.

Thus, by appropriately selecting these parameters, the blocks 46a can be aggregated like a cylinder extending in the Z direction immediately above both X-direction end portions of the sacrificial material 42. For instance, the block 46a can be shaped like a cylinder by making the ratio of PS groups lower than the ratio of PEO groups. Here, the diameter of the cylindrical block 46a has a fixed value resulting from the molecular structure of the PS-PEO polymer, such as the length of the PS group. Furthermore, in the vertical direction (Z direction), the diameter of the block 46a is made uniform. By adjusting the molecular structure of the PS-PEO polymer, the diameter of the block 46a can be controlled to an arbitrary value. In one trench 20, a plurality of blocks 46a are formed, and the block 46b is packed in the trench 20 so as to enclose this plurality of blocks 46a. Hence, the blocks 46a are not in contact with the inner surface of the trench 20.

By way of example, the depth d of the trench 20 is 300 nm (nanometers), the length l is 70 nm, and the width w is 20 nm. In this case, the total molecular weight of the PS-PEO polymer is set to approximately 10000, the ratio between PS groups and PEO groups is set to approximately 1:2, the temperature of heat treatment for phase separation is set to approximately 150-250° C., and the time of this heat treatment is set to several minutes. Then, the block 46a resulting from PS groups can be shaped like a cylinder with a diameter of approximately 10 nm.

Figure 12A:
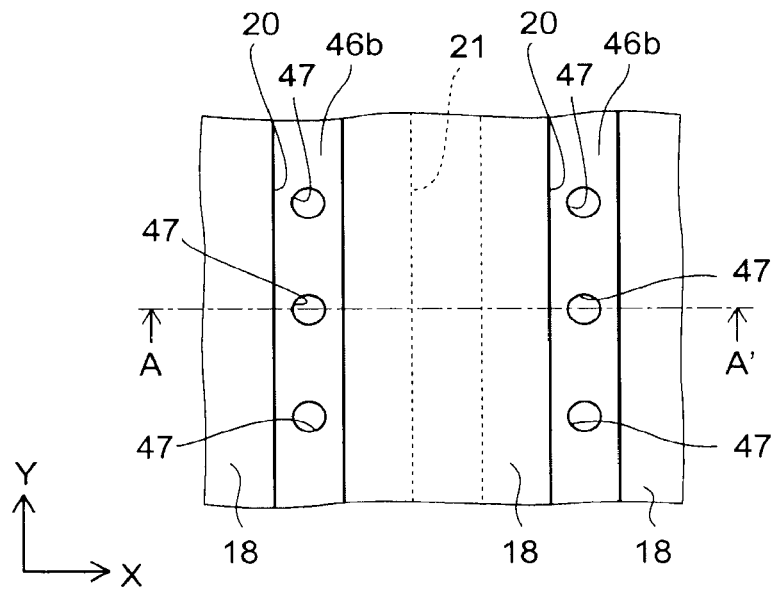
Figure 12B:
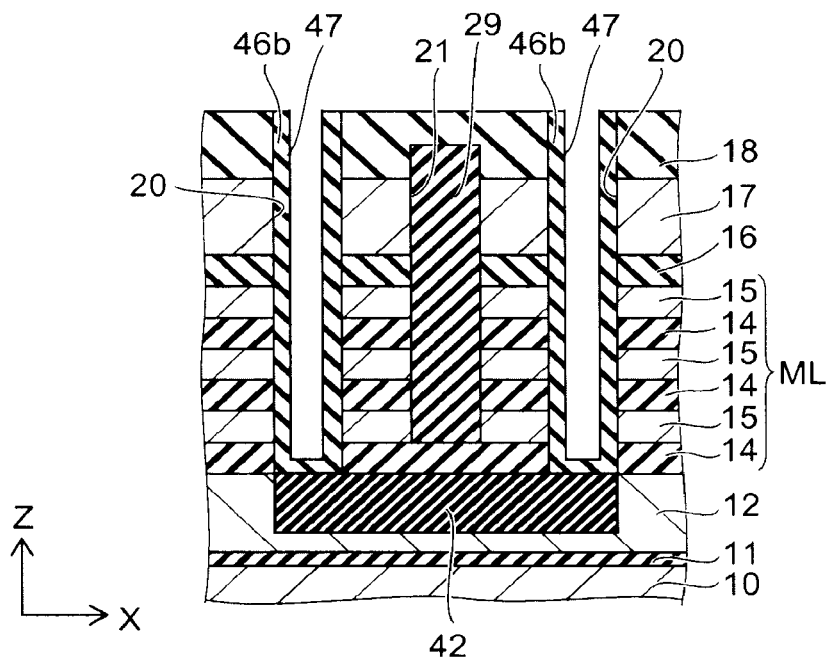

Next, as shown in FIGS. 12A and 12B, by wet etching with hydrofluoric acid or dry etching, the block 46b resulting from polyethylene oxide (PEO) is etched back to expose the upper surface of the block 46a (see FIGS. 11A and 11B). At this time, the exposed surface of the insulating film 18 made of silicon oxide is etched to some extent.

Next, by dry etching with an etching gas containing oxygen or hydrogen and not containing halogens, polystyrene (PS) is selectively etched relative to polyethylene oxide (PEO) and silicon oxide to remove the block 46a (see FIGS. 12A and 12B). Thus, after the block 46a is removed, a hole 47 is formed. The hole 47 extends in the Z direction. The upper surface of the hole 47 is opened. At the bottom surface of the hole 47, the block 46b is left behind. The hole 47 is formed for each block 46a. Hence, a plurality of holes 47 are formed in each trench 20. Here, the shape of the hole 47 is determined by the shape of the block 46a. Hence, the hole 47 is shaped like a cylinder (circular column) with a vertical inner surface and a uniform diameter.

Figure 13A:
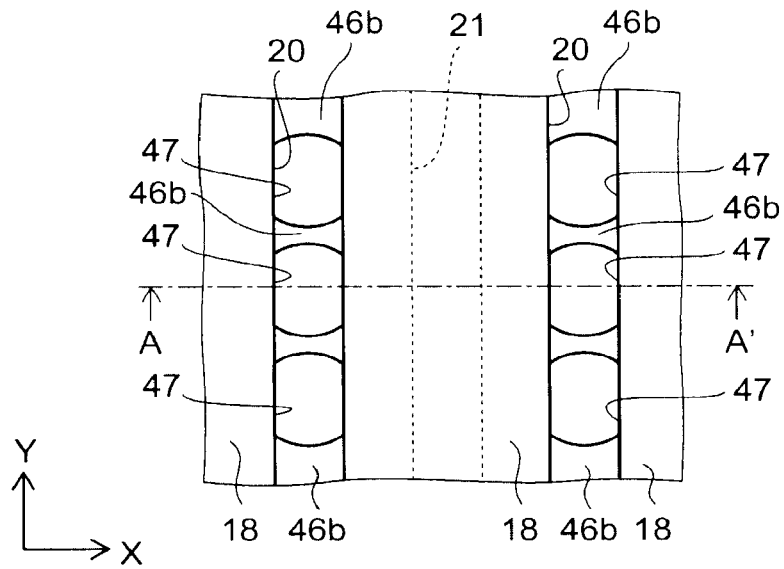
Figure 13B:
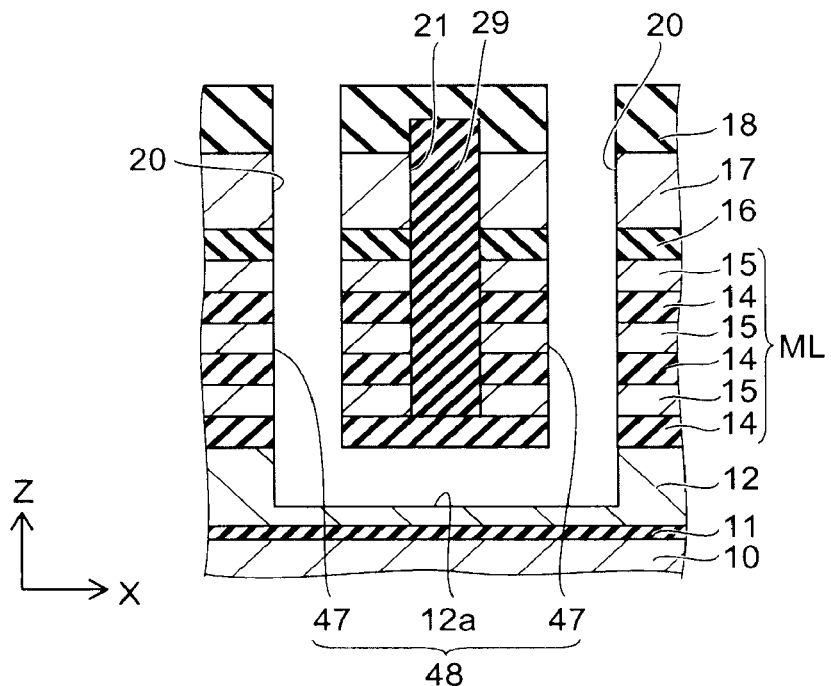

Next, as shown in FIGS. 13A and 13B, by wet etching with hydrofluoric acid, the block 46b is etched through the hole 47. Thus, the side surface of each hole 47 is set back and partly reaches the inner surface of the trench 20, and the bottom surface of the hole 47 is lowered and reaches the bottom surface of the trench 20. This increases the diameter and depth of the hole 47, and changes the shape of the hole 47. That is, as viewed in the Z direction, the shape of the hole 47 includes a pair of circular arcs made of the side surface of the block 46b, and a pair of line segments made of the side surfaces of the trench 20. Furthermore, the bottom surface of the hole 47 includes the sacrificial material 42.

Next, by wet etching with high temperature phosphoric acid, the sacrificial material 42 made of silicon nitride is removed through the hole 47. Thus, the inside of the recess 12a of the conductive film 12 is made hollow to form a U-shaped hole 48 made of the recess 12a and the holes 47. Each U-shaped hole 48 includes one recess 12a and two holes 47 communicating with both end portions of the recess 12a.

Next, as shown in FIGS. 1A and 1B and 2, by the CVD process, a block layer 33 made of silicon oxide, a charge accumulation layer 32 made of silicon nitride, and a tunnel layer 31 made of silicon oxide are deposited in this order on the inner surface of the U-shaped hole 48. The stacked film made of the block layer 33, the charge accumulation layer 32, and the tunnel layer 31 constitutes a memory film 30. Next, polysilicon is deposited on the entire surface. Next, dry etching is performed to remove the portion of the deposited polysilicon located on the upper surface of the insulating film 18. Thus, polysilicon is buried in the U-shaped hole 48 to form a coupling member 26 in the recess 12a and a silicon pillar SP in the hole 47. Here, the block 46b constitutes an insulating member 28. Next, on the insulating film 18, an upper wiring structure including source lines (not shown) and bit lines (not shown) is formed. Thus, the semiconductor memory device 1 according to the embodiment is manufactured.

Next, the operation and effect of the embodiment are described.

In the embodiment, in manufacturing the semiconductor memory device 1, a trench 20 is formed in the stacked body ML. A diblock copolymer is buried in the trench 20 and phase-separated to form a cylindrical block 46a and a block 46b surrounding the block 46a in the trench 20. Then, a hole 47 is formed by removing only the block 46a. A memory film 30 is formed on the inner surface of the hole 47, and a silicon pillar SP is formed inside the hole 47. Thus, memory transistors MT are formed.

Here, the shape of the block 46a is determined by the molecular structure of the diblock copolymer. Thus, the diameter of the block 46a is made uniform throughout the vertical direction. Hence, the diameter of the hole 47 is also made uniform throughout the vertical direction. That is, the taper angle of the side surface of the hole 47 is made nearly equal to 90°. Thus, throughout the vertical direction, the diameter of the silicon pillar SP is made uniform, and the curvature of the memory film 30 is also made uniform. As a result, even if the aspect ratio of the hole 47 is increased, the characteristics are made uniform between the memory transistor MT formed in the upper end portion of the hole 47 and the memory transistor MT formed in the lower end portion of the hole 47. Furthermore, in the embodiment, the holes 47 are formed by the self-organization technique. Hence, the holes 47 have high shape stability. This also contributes to the uniform characteristics of memory transistors MT.

The shape of the blocks 46a and 46b after phase separation depends on the ratio of macromolecules composing the diblock copolymer. In the embodiment, the PS-PEO polymer is used as the diblock copolymer, and the ratio of PS groups is made lower than the ratio of PEO groups. Hence, the block 46a is shaped like a cylinder. Furthermore, the phase separation of the diblock copolymer is affected by the inner surface of the trench 20. Hence, the formation position of the block 46a depends on the shape of the trench 20. In the embodiment, the trench 20 is shaped like a generally rectangular solid, with the depth d of the trench 20 made larger than the length l and the width w, and the length l made larger than the width w. That is, these dimensions are set to satisfy $d > l > w$. Thus, the phase separation of the diblock copolymer buried in the trench 20 is made less likely to be affected by the bottom surface of the trench 20, and provided with no structure in the vertical direction (Z direction). As a result, the cylindrical block 46a extends in the vertical direction.

Furthermore, because the length l of the trench 20 is made longer than the width w, the blocks 46a are arranged in a line along the longitudinal direction of the trench 20 (Y direction). Moreover, the block 46a can be located immediately above the sacrificial material 42 by appropriately selecting the relative position of the trench 20 with respect to the recess 12a.

Furthermore, in the semiconductor memory device 1 according to the embodiment, by forming trenches 20 in the stacked body ML, the conductive film 15 is divided into a plurality of control gate electrodes CG. Then, a hole 47 is formed in part of the trench 20, a memory film 30 is formed on the inner surface of the hole 47, and a silicon pillar SP is provided on the memory film 30. Thus, the memory film 30 is located between the silicon pillar SP and the control gate electrode CG (conductive film 15) to constitute a memory transistor MT. As a result, two memory transistors MT are located at each intersection between one silicon pillar SP and one conductive film 15, enabling storage of at least two bits of information. Furthermore, these two memory transistors MT share the silicon pillar SP. Hence, the packing density can be made higher than that in the case of providing a silicon pillar SP for each memory transistor MT.

Moreover, in the semiconductor memory device 1 according to the embodiment, as viewed in the stacking direction (Z direction), the outer edge of the silicon pillar SP includes a pair of circular arcs and a pair of line segments. Thus, the region 25 of the side surface of the silicon pillar SP opposed to the inner surface of the trench 20 constitutes a plane parallel to the side surface of the trench 20. Hence, in each memory transistor MT, the silicon pillar SP and the control gate electrode CG have a positional relationship of parallel plates. Thus, the electric field is made less likely to concentrate on one location. Furthermore, also in the memory film 30, the electric field is applied uniformly in the film thickness direction. This stabilizes the operation of the memory transistor MT.

Next, a comparative example of the embodiment is described.

FIGS. 14A to 15B are process views illustrating a method for manufacturing a semiconductor memory device according to the comparative example. Here, the figures labeled with "A" are plan views. The figures labeled with "B" are sectional views taken along line A-A' shown in the corresponding figures labeled with "A".

Figure 16A:
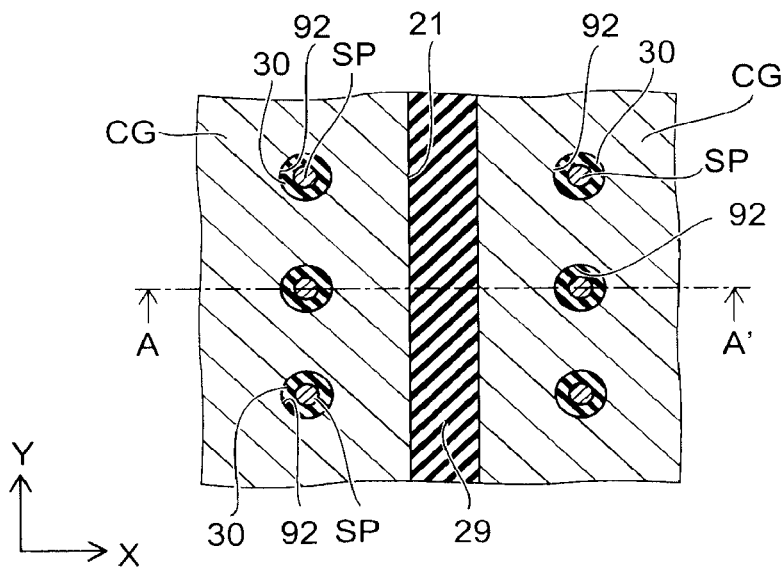
FIGS. 16A and 16B are sectional views illustrating a semiconductor memory device according to the comparative example.
Figure 16B:
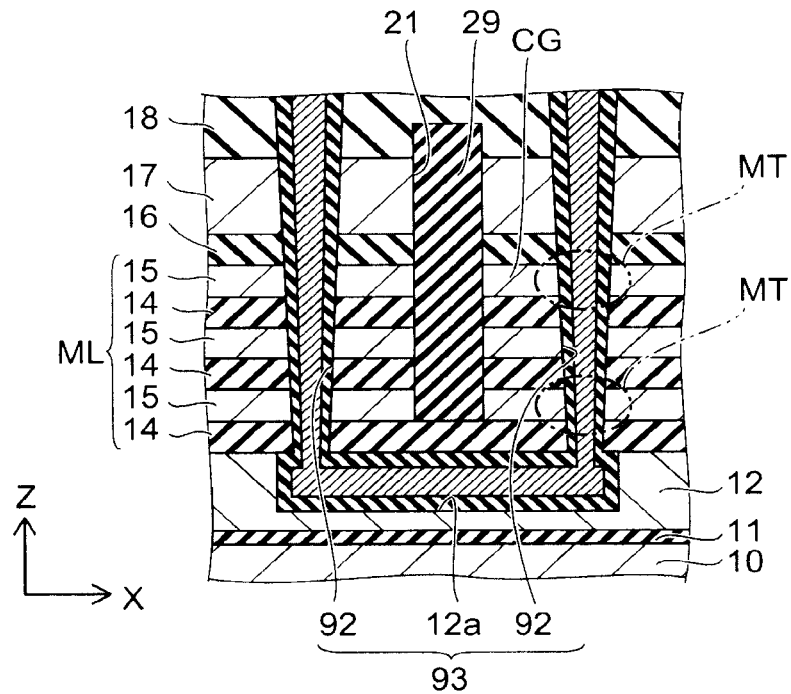

FIGS. 16A and 16B are sectional views illustrating a semiconductor memory device according to the comparative example. FIG. 16A shows a cross section parallel to the upper surface of the silicon substrate. FIG. 16B shows a cross section taken along line A-A' shown in FIG. 16A, i.e., a cross section perpendicular to the upper surface of the silicon substrate.

First, the process shown in FIGS. 3A to 8B is performed.

Figure 14A:
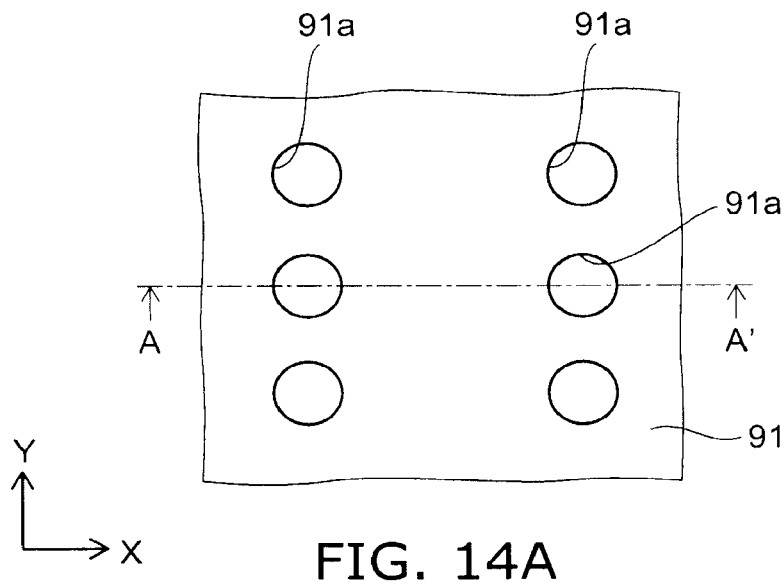
FIGS. 14A to 15B are process views illustrating a method for manufacturing a semiconductor memory device according to a comparative example.
Figure 14B:
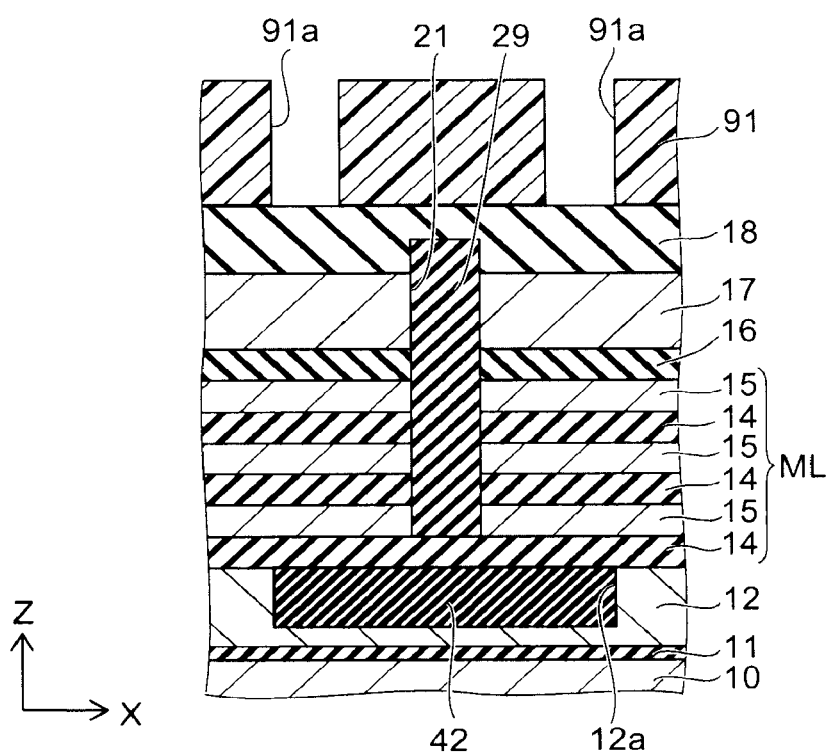

Next, as shown in FIGS. 14A and 14B, a resist film 91 is formed on the insulating film 18. Next, by using the lithography technique, an opening 91a shaped like e.g. a circle is formed immediately above each of both X-direction end portions of the sacrificial material 42 in the resist film 91. Thus, a hole pattern is formed in the resist film 91.

Figure 15A:
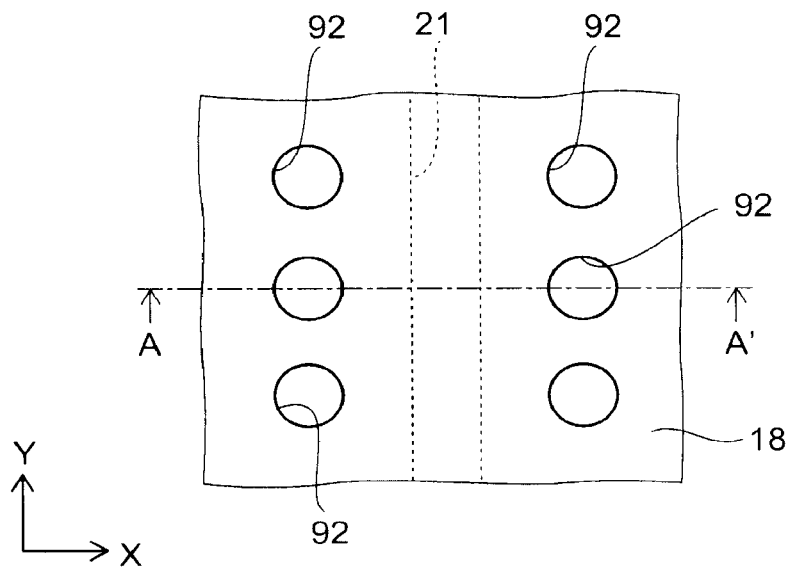
Figure 15B:
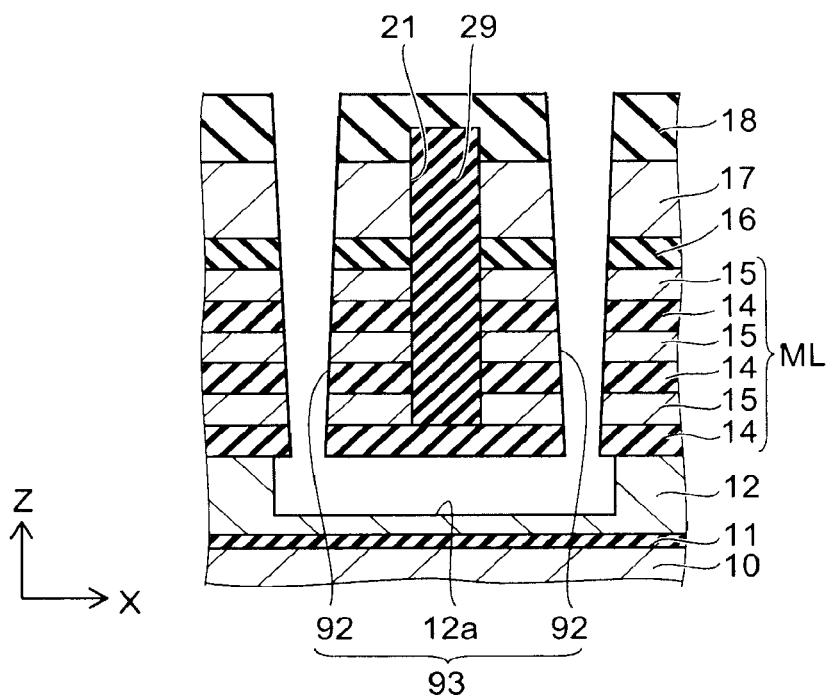

Next, as shown in FIGS. 15A and 15B, the resist film 91 (see FIGS. 14A and 14B) is used as a mask to perform dry etching to selectively remove the insulating film 18, the conductive film 17, the insulating film 16, and the stacked body ML. As a result, a hole 92 reaching the sacrificial material 42 (see FIGS. 14A and 14B) is formed immediately below the opening 91a. In this etching step, the insulating films 18, 16, and 14 made of silicon oxide, in particular, are difficult to process vertically. Thus, the side surface of the hole 92 is inevitably inclined. Hence, the hole 92 is tapered downward. Subsequently, ashing is performed to remove the resist film 91.

Next, by wet etching with high temperature phosphoric acid, the sacrificial material 42 (see FIGS. 14A and 14B) is removed through the hole 92. Thus, two holes 92 adjacent in the X direction are coupled through the recess 12a of the conductive film 12 to form a U-shaped hole 93.

Next, as shown in FIGS. 16A and 16B, like the above first embodiment, by the CVD process, a block layer 33, a charge accumulation layer 32, and a tunnel layer 31 are deposited on the inner surface of the U-shaped hole 93. Thus, a memory film 30 is formed. Next, polysilicon is buried in the U-shaped hole 93 to form a silicon pillar SP and a coupling member 26. Thus, the semiconductor memory device according to the comparative example is manufactured.

In the comparative example, in the step shown in FIGS. 15A and 15B, holes 92 are formed by dry etching. However, in this case, the side surface of the hole 92 is inevitably inclined, and the diameter of the hole 92 decreases downward. One reason for this is the variation in the incident angle of ions used for dry etching. For instance, consider the case where the incident angle of ions is inclined 5° with respect to the vertical direction (Z direction). In this case, if the aspect ratio of the hole 92 exceeds 11.5 (=1/tan(5°)), no ions directly reach the bottom surface of the hole 92. Then, only the ions once reflected by impingement on the side surface of the hole 92 reach the bottom surface of the hole 92. Thus, in the subsequent etching, the number of ions directly reaching the bottom surface of the hole 92 decreases, and makes vertical processing difficult.

For instance, the diameter of the opening 91a of the resist film 91 is set to 30 nm (nanometers), and consider the case of forming a hole 92 with a depth of 1 μm (micron). Then, the aspect ratio exceeds 30. In this case, for the above-mentioned reason, etching is made difficult, and the hole 92 is tapered downward. As a result, in the memory transistor MT formed in the lower portion of the stacked body ML, as compared with the memory transistor MT formed in the upper portion, the silicon pillar SP is made slimmer, and the curvature of the memory film 30 is made larger. This causes the amount of charge accumulated in the memory transistor MT to vary with the formation position. Hence, in the semiconductor memory device according to the comparative example, the characteristics of memory transistors MT are varied with the formation position. This degrades the overall characteristics of the semiconductor memory device.

In contrast, in the semiconductor memory device 1 according to the above first embodiment, the holes 47 are formed by the self-organization technique. Hence, even if the aspect ratio of the hole 47 is increased, the diameter can be made uniform. As a result, the characteristics of memory transistors MT can be made uniform. This improves the overall characteristics of the semiconductor memory device 1.

Here, the variation in the taper angle of the hole required in the semiconductor memory device having the three-dimensional structure as described above can be calculated as follows. To limit the variation in the surface area of the charge accumulation layer 32 to 10% or less, the variation in the diameter of the hole also needs to be limited to 10% or less. Hence, for instance, in the case where the diameter of the upper end portion of the hole is 30 nm, the diameter of the lower end portion needs to be set to 27 nm or more. With the depth of the hole set to 1 μm, the taper angle of the side surface of the hole needs to be 89.9° (=tan$^{-1}$(1000/1.5)) or more. That is, the side surface of the hole needs to be nearly vertical. Such processing is very difficult to realize by etching, but easy by using the self-organization technique.

In the comparative example, the hole 92 is formed by lithography and dry etching. Hence, the shape of the hole 92 as viewed in the Z direction may be deviated from a perfect circle. If the shape of the hole 92 is deviated from a perfect circle, a portion having a high curvature may occur at the inner surface of the hole 92 and the outer surface of the memory film 30 and the silicon pillar SP. The electric field may concentrate on this portion. This increases the operational variation at the time of writing and reading data. Furthermore, because the memory film 30 is formed cylindrically, the electric field applied to the inner tunnel layer 31 is made stronger than that applied to the outer block layer 33.

In contrast, in the first embodiment, the shape of the hole 47 is determined by the molecular structure of the diblock copolymer, and hence made uniform at the molecular level. This suppresses the operational variation at the writing/reading time. Furthermore, the portion of the memory transistor MT subjected to the electric field has a planar structure. Hence, the electric field is less likely to concentrate on this portion.

Furthermore, in the comparative example, the trench 20 (see FIGS. 1A and 1B) is not formed. Hence, the conductive film 15 is not divided by the trench 20 to both sides of the silicon pillar SP. Thus, only one memory transistor MT is formed at each intersection between one silicon pillar SP and one conductive film 15. As a result, the information storage density is halved as compared with the above first embodiment.

Next, a second embodiment is described.

Figure 17A:
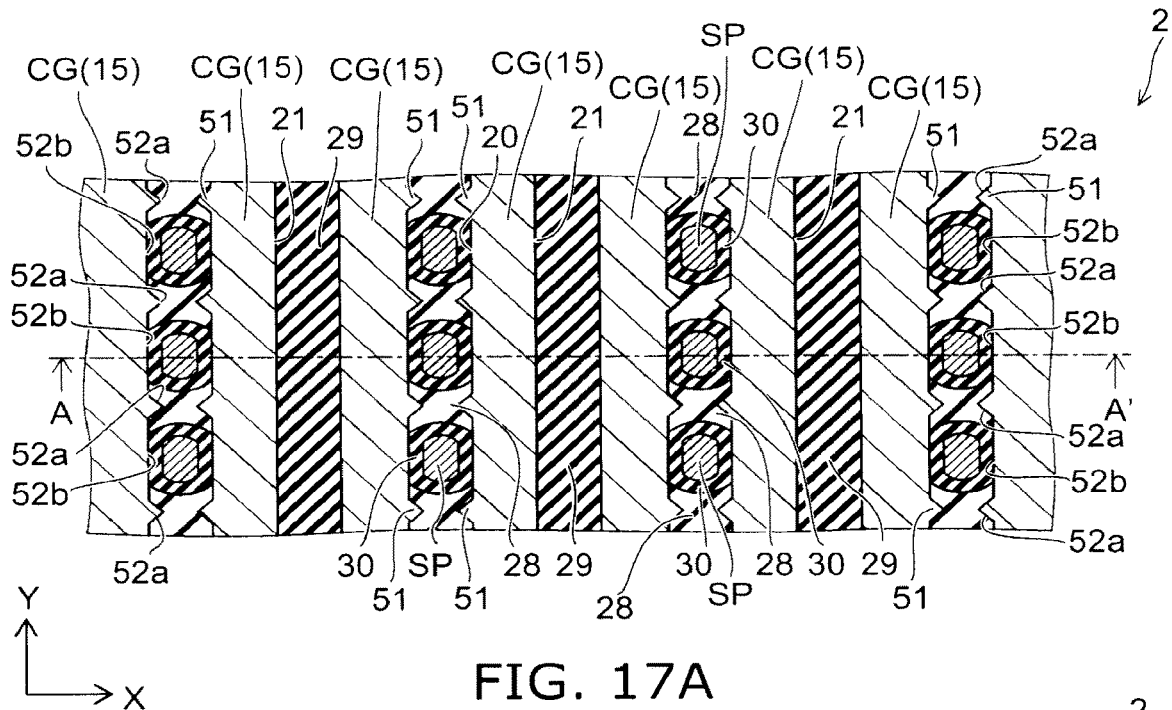
FIGS. 17A and 17B are sectional views illustrating a semiconductor memory device according to a second embodiment.
Figure 17B:
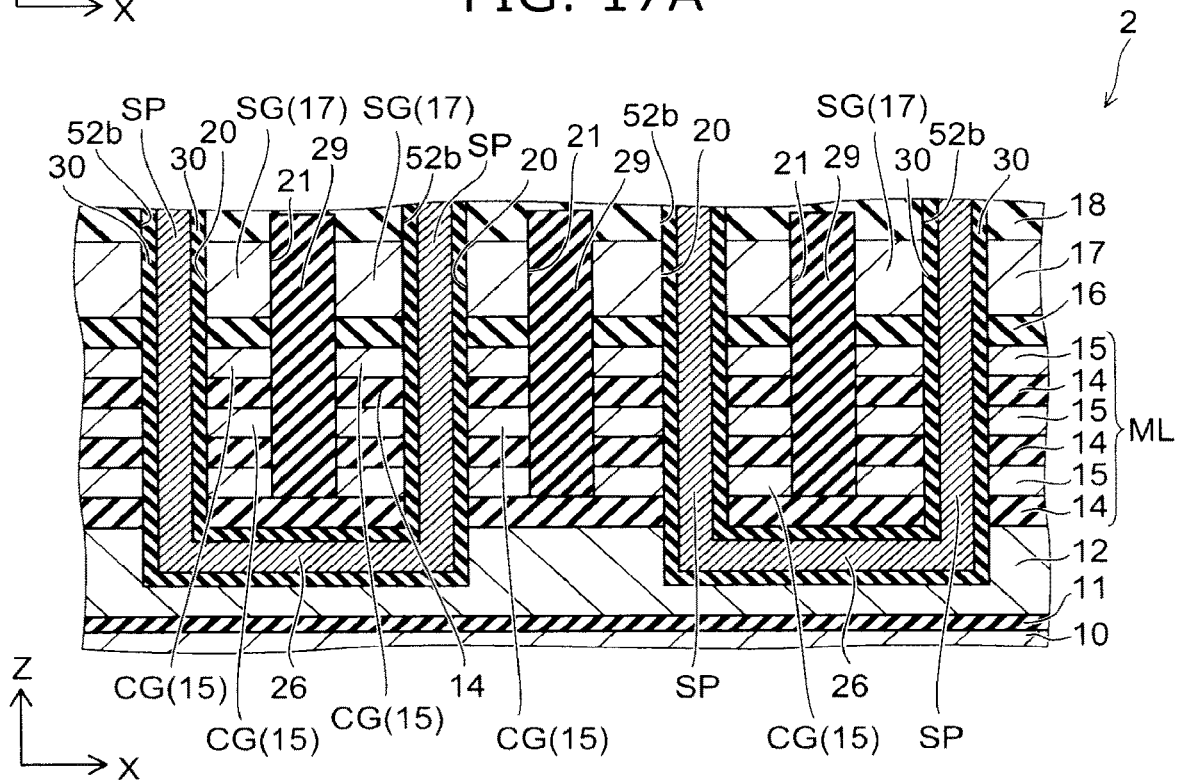

FIGS. 17A and 17B are sectional views illustrating a semiconductor memory device according to the embodiment. FIG. 17A shows a cross section parallel to the upper surface of the silicon substrate. FIG. 17B shows a cross section taken along line A-A' shown in FIG. 17A, i.e., a cross section perpendicular to the upper surface of the silicon substrate.

As shown in FIGS. 17A and 17B, the semiconductor memory device 2 according to the embodiment is different from the semiconductor memory device 1 (see FIGS. 1A and 1B) according to the above first embodiment in that a guide 51 projected toward the inside of the trench 20 is formed at both side surfaces of the trench 20. The guide 51 is formed from the stacked body ML, the insulating film 16, the conductive film 17, and the insulating film 18 left behind. The guides 51 are periodically arranged along the Y direction. The phase of the arrangement is equal at both side surfaces of the trench 20. Thus, the portion of the trench 20 provided with the guide 51 constitutes a narrow width portion 52a having a relatively narrow width. On the other hand, the portion of the trench 20 not provided with the guide 51 constitutes a wide width portion 52b having a relatively wide width. In each trench 20, the narrow width portions 52a and the wide width portions 52b are alternately arranged along the Y direction. The silicon pillar SP and the memory film 30 are located in the wide width portion 52b.

Next, a method for manufacturing a semiconductor memory device according to the embodiment is described.

Figure 18A:
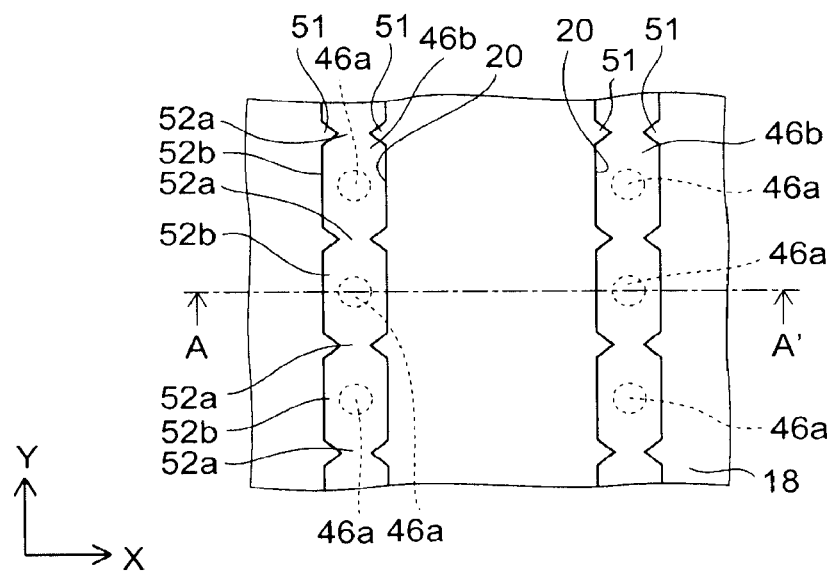
FIGS. 18A and 18B are process views illustrating a method for manufacturing a semiconductor memory device according to the second embodiment.
Figure 18B:
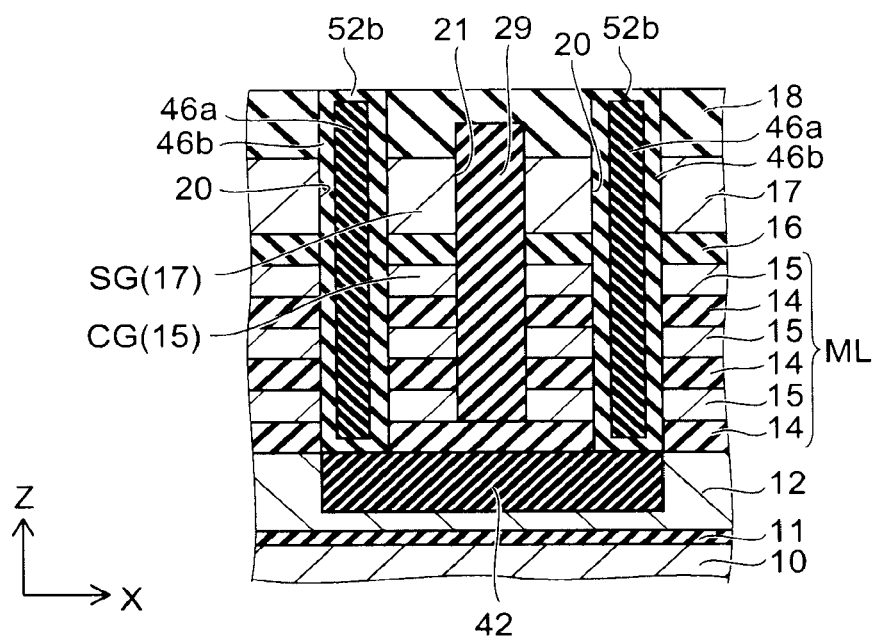

FIGS. 18A and 18B are process views illustrating the method for manufacturing a semiconductor memory device according to the embodiment. FIG. 18A is a plan view. FIG. 18B is a sectional view taken along line A-A' shown in FIG. 18A.

First, the process shown in FIGS. 3A to 10B is performed. Here, as shown in FIGS. 18A and 18B, the pattern of the resist film 44 is adjusted so that a guide 51 projected toward the inside of the trench 20 is formed at both side surfaces of the trench 20. The guides 51 are periodically arranged along the longitudinal direction of the trench 20 (Y direction). Furthermore, the phase of the arrangement is matched between both side surfaces of the trench 20. Thus, in the trench 20, along its longitudinal direction (Y direction), narrow width portions 52a where the guides 51 are formed on both sides and the width is relatively narrow, and wide width portions 52b where the guides 51 are not formed and the width is relatively wide, are alternately arranged.

Next, like the above first embodiment, a diblock copolymer is buried inside the trench 20 and phase-separated. At this time, the hydrophilic block 46b is formed along the inner surface of the trench 20 including the guide 51, whereas the hydrophobic block 46a is formed at a position spaced by a prescribed distance from the inner surface of the trench 20 including the guide 51. Thus, the block 46a is formed like a cylinder extending in the Z direction in the central portion of the wide width portion 52b. Subsequently, like the above first embodiment, the process shown in FIGS. 12A to 13B is performed. Thus, the silicon pillar SP and the memory film 30 are located in the wide width portion 52b of the trench 20.

According to the embodiment, the guide 51 is provided at the inner surface of the trench 20. This can reliably control the shape and position of the block 46a. Thus, the shape and position of the silicon pillar SP and the memory film 30 can be reliably controlled. The configuration, the manufacturing method, and the operation and effect of the embodiment other than the foregoing are similar to those of the above first embodiment.

Next, a third embodiment is described.

Figure 19A:
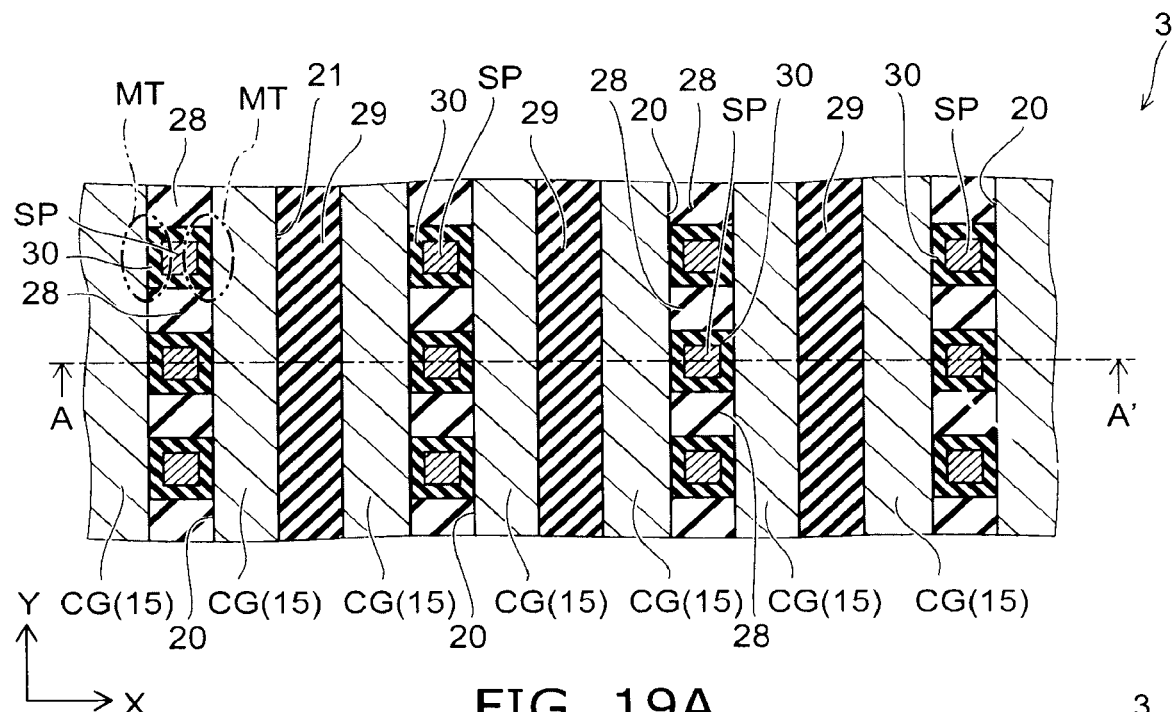
FIGS. 19A and 19B are sectional views illustrating a semiconductor memory device according to a third embodiment.
Figure 19B:
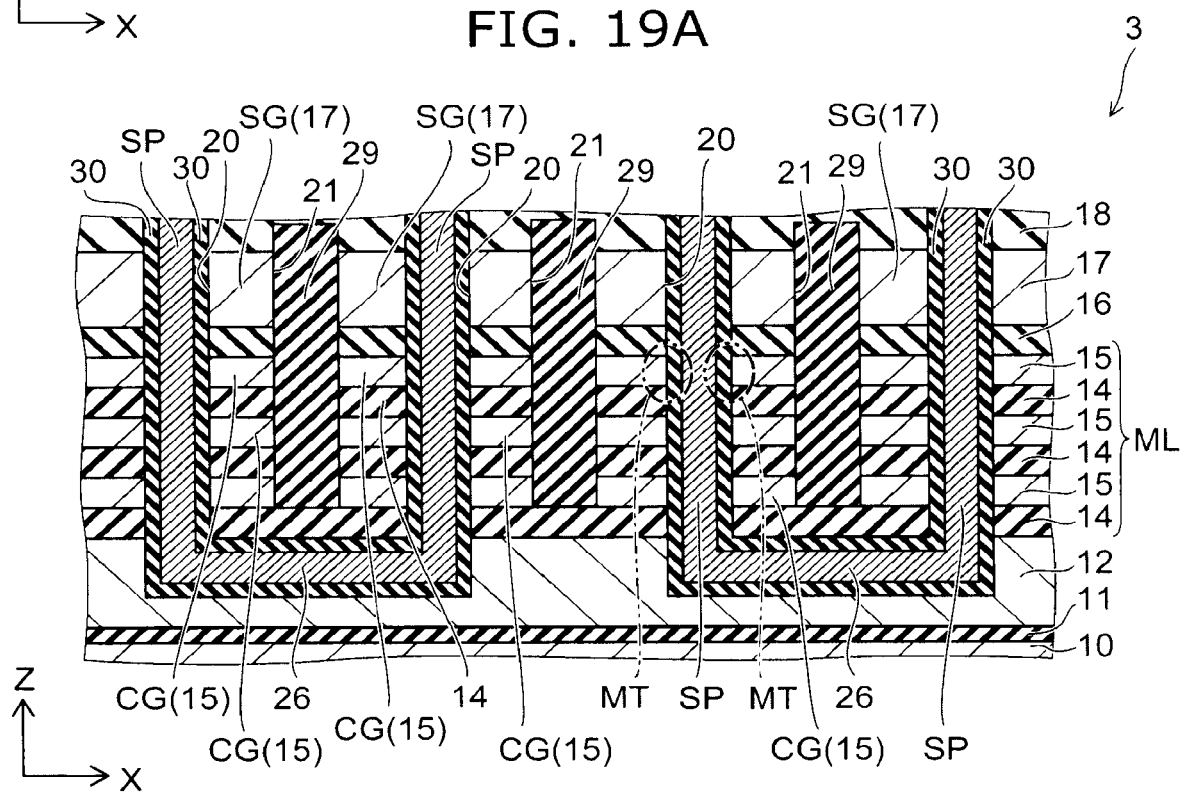

FIGS. 19A and 19B are sectional views illustrating a semiconductor memory device according to the embodiment. FIG. 19A shows a cross section parallel to the upper surface of the silicon substrate. FIG. 19B shows a cross section taken along line A-A' shown in FIG. 19A, i.e., a cross section perpendicular to the upper surface of the silicon substrate.

As shown in FIGS. 19A and 19B, the semiconductor memory device 3 according to the embodiment is different from the semiconductor memory device 1 (see FIGS. 1A and 1B) according to the above first embodiment in that as viewed in the Z direction, the silicon pillar SP is shaped like a rectangle, and the memory film 30 is shaped like a frame. Between the memory films 30 in the trench 20, an insulating member 28 including e.g. silicon oxide is provided.

Next, a method for manufacturing a semiconductor memory device according to the embodiment is described.

FIGS. 20A to 21B are process views illustrating the method for manufacturing a semiconductor memory device according to the embodiment. The figures labeled with "A" are plan views. The figures labeled with "B" are sectional views taken along line A-A' shown in the corresponding figures labeled with "A".

First, the process shown in FIGS. 3A to 10B is performed.

Figure 20A:
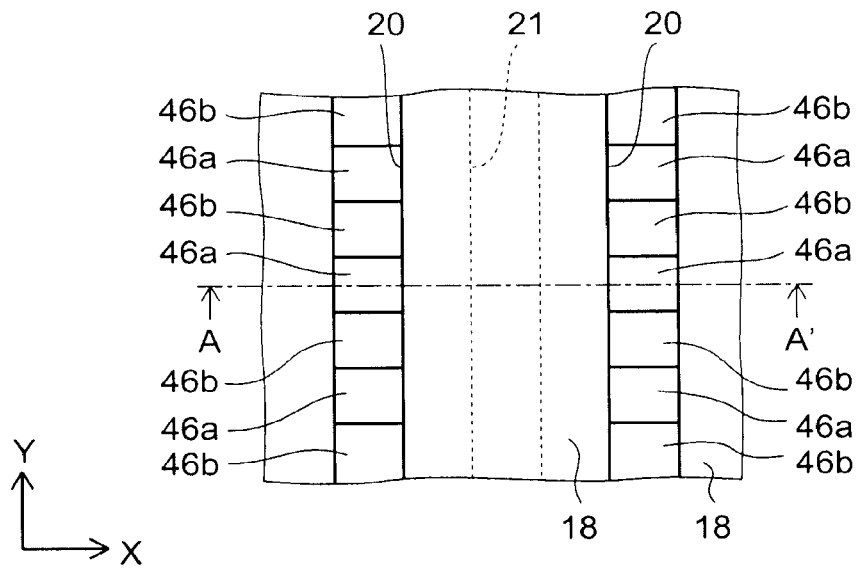
FIGS. 20A to 21B are process views illustrating a method for manufacturing a semiconductor memory device according to the third embodiment.
Figure 20B:
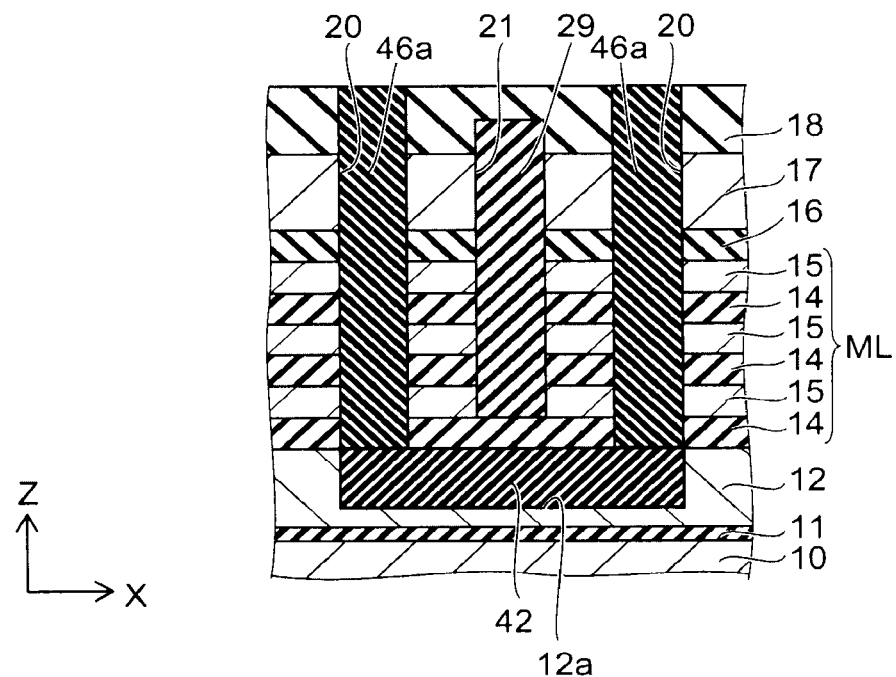

Next, as shown in FIGS. 20A and 20B, as a block copolymer, a diblock copolymer is applied and buried in the trench 20. As the diblock copolymer, for instance, a PS-PEO polymer is used. In the embodiment, the ratio between PS groups and PEO groups is set to approximately 1:1.

Next, by heat treatment, the PS-PEO polymer is phase-separated. Here, the phase structure after separation is a lamellar structure in which blocks 46a resulting from PS groups and blocks 46b resulting from PEO groups are alternately arranged along the longitudinal direction of the trench 20 (Y direction). The blocks 46a and 46b are both shaped like a rectangular column extending in the Z direction. Hence, as viewed in the Z direction, the blocks 46a and 46b are both shaped like a rectangle. In the Z direction, each size of the blocks 46a and 46b is uniform. Furthermore, the blocks 46a and 46b are both in contact with the side surface and bottom surface of the trench 20. The upper surface of the blocks 46a and 46b is exposed.

Figure 21A:
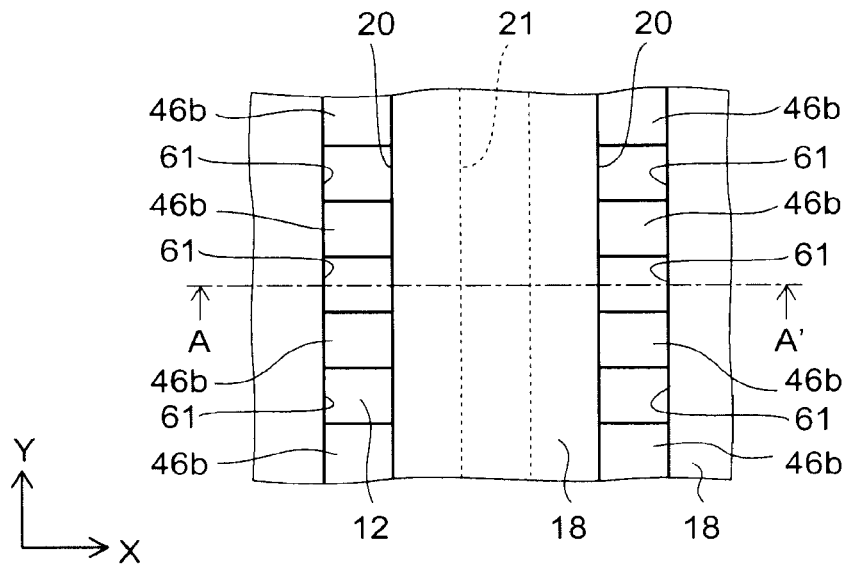
Figure 21B:
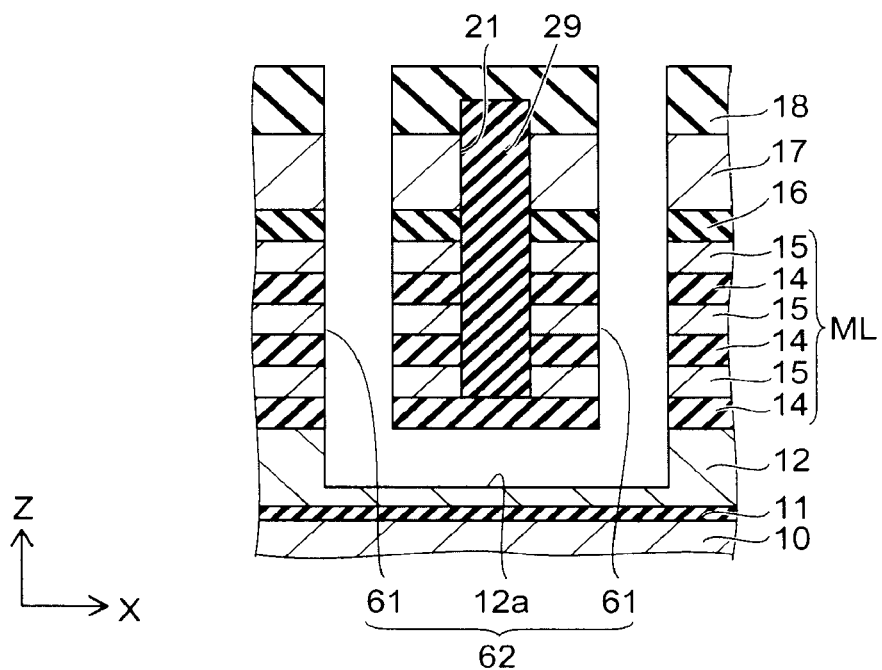

Next, as shown in FIGS. 21A and 21B, by dry etching with an etching gas containing oxygen or hydrogen and not containing halogens, the block 46a is removed. Thus, after the block 46a is removed, a hole 61 is formed. The hole 61 extends in the Z direction. The upper surface of the hole 61 is opened. At the bottom surface of the hole 61, the sacrificial material 42 is exposed. At part of the side surface of the hole 61, the side surface of the trench 20 is exposed. The shape of the hole 61 is determined by the shape of the block 46a. Hence, the hole 61 is shaped like a rectangular column with a vertical inner surface and a uniform width.

Next, by wet etching with high temperature phosphoric acid, the sacrificial material 42 is removed through the hole 61. Thus, the inside of the recess 12a of the conductive film 12 is made hollow to form a U-shaped hole 62 made of the recess 12a and the holes 61. Each U-shaped hole 62 includes one recess 12a and two holes 61 communicating with both end portions of the recess 12a.

Next, as shown in FIGS. 19A and 19B, by the CVD process, a block layer 33 (see FIGS. 2A and 2B), a charge accumulation layer 32 (see FIGS. 2A and 2B), and a tunnel layer 31 (see FIGS. 2A and 2B) are deposited in this order on the inner surface of the U-shaped hole 62 to form a memory film 30. As viewed in the Z direction, the memory film 30 is shaped like a frame. Next, polysilicon is buried inside the U-shaped hole 62 to form a coupling member 26 in the recess 12a and a silicon pillar SP in the hole 61. As viewed in the Z direction, the silicon pillar SP is shaped like a rectangle. The block 46b left behind constitutes an insulating member 28. Next, on the insulating film 18, an upper structure including source lines (not shown) and bit lines (not shown) is formed. Thus, the semiconductor memory device 3 according to the embodiment is manufactured.

According to the embodiment, the block structure of the phase-separated PS-PEO polymer is set to a lamellar structure. Thus, the block 46a can be formed in contact with the side surface and bottom surface of the trench 20, with the upper surface of the block 46a exposed. Hence, the hole 61 can be formed simply by removing the block 46a. This eliminates the need to etch the block 46b before and after the step of removing the block 46a. As a result, the process for manufacturing the semiconductor memory device 3 can be simplified.

The configuration, the manufacturing method, and the operation and effect of the embodiment other than the foregoing are similar to those of the above first embodiment.

In the examples illustrated in the above embodiments, a copolymer of polystyrene (PS) and polyethylene oxide (PEO) is used as a diblock copolymer. However, the invention is not limited thereto. The diblock copolymer can be made of any material as long as it is separated into two or more kinds of blocks by phase separation, at least one kind of blocks have a shape extending in the Z direction with uniform thickness, and this block extending in the Z direction can be removed by a suitable method. Here, if the block left behind is insulative and stable as a device material, this block can be directly used as an insulating member for separation between the memory films. In view of these points, preferably, the block to be removed is made of an organic material, and the block to be left behind is made of an inorganic material. However, if the block to be left behind is unsuitable as a device material, this block can be replaced by another insulating material after forming the memory film and the silicon pillar.

The embodiments described above can realize a semiconductor memory device with uniform characteristics of memory transistors, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a stacked body including a plurality of insulating layers and a plurality of conductive films, each of the plurality of insulating layers and each of the plurality of conductive films being alternately stacked, a trench being formed in the stacked body, the trench extending in a first direction, and each of the conductive films being divided by the trench;
   a plurality of semiconductor pillars provided in the trench and extending in a stacking direction of the insulating layers and the conductive films; and
   an insulating member provided in the trench between adjacent of the semiconductor pillars in the first direction, the insulating member including a pair of non-flat surfaces facing a pair of side surfaces of the trench extending along the first direction and a pair of curved surfaces facing the adjacent semiconductor pillars on both sides of the insulating member in the first direction, the curved surfaces each having an arc shape as viewed in the stacking direction, wherein, on the both sides of the insulating member in the first direction, one of the pair of curved surfaces being located at one side in the first direction and the other of the pair of curved surfaces being located at the other side in the first direction with respect to the pair of non-flat surfaces between the adjacent semiconductor pillars,
   a pair of memory transistors being provided so as to correspond to regions of each of the semiconductor pillars, the regions facing the pair of side surfaces of the trench, the pair of memory transistors being disposed at an intersection between one of the semiconductor pillars and one of the conductive films.

2. The device according to claim 1, wherein each of the regions facing the pair of side surfaces of the trench includes a substantially flat side surface parallel to the side surfaces of the trench.

3. The device according to claim 1, wherein the pair of memory transistors are arranged in a second direction intersecting with the first direction and the stacking direction.

4. The device according to claim 1, further comprising:
   an insulating material provided between the regions of each of the semiconductor pillars and the conductive films.

5. The device according to claim 1, wherein one of the pair of memory transistors includes a charge trap portion between one region of the regions of each of the semiconductor pillars and one of the conductive films.

6. The device according to claim 5, wherein the charge trap portion is formed from silicon nitride.

7. The device according to claim 5, wherein one of the pair of memory transistors further includes a tunnel layer between the charge trap portion and one region of the regions of each of the semiconductor pillars.

8. The device according to claim 7, wherein the tunnel layer includes silicon and oxygen.

9. The device according to claim 5, wherein one of the pair of memory transistors further includes a block layer between the charge trap portion and one of the conductive films.

10. The device according to claim 9, wherein the block layer includes silicon and oxygen.

11. A semiconductor memory device, comprising:
a stacked body including a plurality of insulating layers and a plurality of conductive films, each of the plurality of insulating layers and each of the plurality of conductive films being alternately stacked, a trench being formed in the stacked body, the trench extending in a first direction, and each of the conductive films being divided by the trench;
a plurality of semiconductor pillars provided in the trench and extending in a stacking direction of the insulating layers and the conductive films; and
an insulating member provided between the semiconductor pillars in the trench, the insulating member including a pair of non-flat surfaces facing a pair of side surfaces of the trench extending along the first direction and a pair of curved surfaces facing the semiconductor pillars on both sides in the first direction, the curved surfaces each having an arc shape as viewed in the stacking direction,
a pair of memory transistors being provided so as to correspond to regions of each of the semiconductor pillars, the regions facing the pair of side surfaces of the trench, the pair of memory transistors being disposed at an intersection between one of the semiconductor pillars and one of the conductive films,
wherein each of the regions facing the pair of side surfaces of the trench includes a substantially flat side surface parallel to the side surfaces of the trench.

12. The device according to claim 11, wherein the pair of memory transistors are arranged in a second direction intersecting with the first direction and the stacking direction.

13. The device according to claim 11, wherein the insulating member includes a plurality of insulating portions provided at intervals in the first direction in the trench and the semiconductor pillars and the insulating portions are alternately arranged in the first direction in the trench.

14. The device according to claim 11, further comprising:
an insulating material provided between the regions of each of the semiconductor pillars and the conductive films.

15. The device according to claim 11, wherein one of the pair of memory transistors includes a charge trap portion between one region of the regions of each of the semiconductor pillars and one of the conductive films.

16. The device according to claim 15, wherein the charge trap portion is formed from silicon nitride.

17. The device according to claim 15, wherein one of the pair of memory transistors further includes a tunnel layer between the charge trap portion and one region of the regions of each of the semiconductor pillars.

18. The device according to claim 17, wherein the tunnel layer includes silicon and oxygen.

19. The device according to claim 15, wherein one of the pair of memory transistors further includes a block layer between the charge trap portion and one of the conductive films.

20. The device according to claim 19, wherein the block layer includes silicon and oxygen.

* * * * *